United States Patent
Ichikawa et al.

(10) Patent No.: US 7,205,092 B2
(45) Date of Patent: Apr. 17, 2007

(54) PHOTOSENSITIVE RESIN PRINTING PLATE ORIGINAL, PROCESS FOR PRODUCING THE SAME AND PROCESS FOR PRODUCING RESIN RELIEF PRINTING PLATE THEREWITH

(75) Inventors: Michihiko Ichikawa, Okazaki (JP); Tamio Adachi, Okazaki (JP); Shinji Tanaka, Okazaki (JP); Yoshiki Ichii, Okazaki (JP)

(73) Assignee: Toray Industries, Inc. (JP)

( * ) Notice: Subject to any disclaimer, the term of this patent is extended or adjusted under 35 U.S.C. 154(b) by 0 days.

(21) Appl. No.: 10/530,632

(22) PCT Filed: Oct. 22, 2003

(86) PCT No.: PCT/JP03/13478

§ 371 (c)(1),
(2), (4) Date: Apr. 7, 2005

(87) PCT Pub. No.: WO2004/038507

PCT Pub. Date: May 6, 2004

(65) Prior Publication Data

US 2006/0008729 A1    Jan. 12, 2006

(30) Foreign Application Priority Data

Oct. 24, 2002  (JP) ............................. 2002-309435

(51) Int. Cl.
*G03F 7/095*  (2006.01)
*G03F 7/004*  (2006.01)
*G03F 7/00*   (2006.01)

(52) U.S. Cl. .................................. 430/273.1; 430/302

(58) Field of Classification Search ............. 430/273.1, 430/300, 306
See application file for complete search history.

(56) References Cited

U.S. PATENT DOCUMENTS 3,615,630 A * 10/1971 Dietrich .................... 430/270.1
3,751,259 A *  8/1973 Bauer et al. ............. 430/288.1
4,132,168 A    1/1979 Peterson

FOREIGN PATENT DOCUMENTS

| EP | 0 741 330 A1 | * | 11/1996 |
| EP | 1 152 296 A1 | * | 11/2001 |
| WO | WO-94/03838 A1 | * | 8/1993 |

OTHER PUBLICATIONS

Taggi et al, "Printing Processes", Kirk-Othmer Encyclopedia of Chemical Technology, 1996, PDF version from online at Wiley InterScience, 59 pages.*
RN 1680-21-3, Registry, ACS on STN, copyright 2006, "Light Acrylate 3EG-A".*

* cited by examiner

*Primary Examiner*—Cynthia Hamilton
(74) *Attorney, Agent, or Firm*—DLA Piper US LLP

(57) ABSTRACT

A photosensitive resin printing plate precursor including: a photosensitive resin layer (A) containing a water-soluble or water-dispersible resin and an ultraviolet-curable monomer; and a water-insoluble heat-sensitive mask layer (C) containing an infrared-absorbing material, deposited in that order on a support is disclosed. By introducing a crosslinked structure or a hydrophobic constituent to the heat-sensitive mask layer (C) so as to be insoluble in water, a difference in polarity is produced between the layers (A) and (C) and, thus, mass transfer between the two layers can be prevented. Also, the scratch resistance of the heat-sensitive mask layer (C) can be dramatically enhanced and, thus, the printing plate precursor becomes easy to handle.

16 Claims, No Drawings

PHOTOSENSITIVE RESIN PRINTING PLATE ORIGINAL, PROCESS FOR PRODUCING THE SAME AND PROCESS FOR PRODUCING RESIN RELIEF PRINTING PLATE THEREWITH

TECHNICAL FIELD

The present invention relates to a photosensitive resin printing plate precursor suitable for digital information transfer, which is to be exposed to light in an image form and then developed with water or a water-based liquid, to a method for producing the same, and to a method for producing a letterpress printing plate using the same.

BACKGROUND ART

Photosensitive resin compositions are generally used for printing plates, and their use is the mainstream in the fields of letterpress printing, lithography, intaglio printing, and flexographic printing.

For such a printing plate, a photosensitive resin layer is brought into close contact with an original pattern film and exposed to light through the original pattern film so as to form portions soluble and insoluble in a solvent, and thus a relief pattern is formed and used as a printing plate.

The printing plate requires a negative or a positive original pattern film, and accordingly the time and cost of its production increase. In addition, since the original pattern film must be developed by chemical treatment and the waste liquid from the development must be treated, the use of the printing plate involves environmental health problems.

A so-called CTP (computer to plate) process in which information processed on a computer is directly output on a printing plate to prepare a relief printing plate without the step of forming an original pattern film has been proposed in association with the advance of computers. In the CTP process, an image mask is formed over a photosensitive resin layer "in situ" with a laser controlled by digital data, and then, the entire surface of the photosensitive resin layer is exposed to active light, typically, ultraviolet light, through the image mask, so that only the regions of photosensitive resin layer not covered with the image mask are selectively cured. The process has some advantages. For example, since this process does not require the above-described step of forming an original pattern film or treatment of waste liquid from development of the original pattern film, it is advantageous in environmental health. In addition, the process can provide a sharp relief.

Specifically, a method of forming an image mask coating on a photosensitive recording component with an ink jet printer or an electrophotographic printer has been proposed (see, for example, German Patent Publication No. 4117127 (Page 1)). Unfortunately, this method cannot provide fine images.

Another method has also been proposed in which a photosensitive flexographic recording material including a photosensitive elastomeric layer, an infrared-sensitive layer opaque to ultraviolet light, and a cover sheet is irradiated with infrared laser light to form an image mask coating (see, for example, U.S. Pat. No. 5,607,814 (columns 17 to 18)). The upper portions of regions irradiated with infrared light of the infrared-sensitive layer adhere to the cover sheet. The regions irradiated with infrared laser light of the infrared-sensitive layer are selectively removed by peeling off the cover sheet. Unfortunately, this method may give damage like scratches to the cover sheet, which can doubles as a protective layer, and thus the damage results in incomplete information transfer disadvantageously. Also, the development by peeling off the infrared-sensitive layer causes the regions unirradiated with infrared laser light to peel easily, and it is therefore unsuitable for the formation of fine image masks.

Even in the field of relief printing, the CTP process has been generally proposed for flexographic printing plate, which are made of an elastomeric binder, such as butadiene rubber or styrene rubber, as a resin, and can use an aqueous ink. On the other hand, in the field of letterpress printing plate, which are made of a soluble resin instead of the elastomeric binder and can use an oil-based ink, there are few methods for the CTP process proposed. This is because the polarities of the infrared-sensitive layer and the photosensitive resin layer, which is made of the soluble resin, are liable to be close, and consequently the infrared-sensitive layer and the photosensitive resin layer are liable to be mixed with time.

In the printing using flexographic plates, the printing between the plate cylinder and the impression cylinder is set weak because the relief to which an image is transferred is soft. The flexographic plate is suitable for printing on corrugated boards having uneven surfaces and flexible packaging films less resistant to high printing pressure. In contrast, in the letterpress printing, the printing pressure between the plate cylinder and the impression cylinder can be set high. This is because the relief is so hard as not to be deformed by high printing pressure and, accordingly, the degradation of printing quality, such as increase in width of letters, is prevented. By increasing printing pressure with use of a letterpress plate, ink can be applied at a large thickness to give a texture of strength to printed material, and metal, to which it is relatively difficult to transfer ink, can be printed on.

For the photosensitive letterpress printing plate using the CTP process, a photosensitive letterpress recording material has been proposed which includes a photosensitive resin layer, an oxygen-transmissive interlayer if necessary, an infrared-sensitive layer opaque to ultraviolet light, and a protective layer (see, for example, U.S. Pat. No. 6,020,108 (columns 11 to 12)). After the protective layer is peeled off, the infrared-sensitive layer is irradiated with infrared laser light to form an image mask. After the entire surface is exposed to ultraviolet light, the image mask and the uncured regions of the photosensitive layer are removed by the same developer. The oxygen-transmissive interlayer prevents mass transfer between the photosensitive resin layer and the infrared-sensitive layer and removal of the photosensitive resin layer by laser engraving. The infrared-sensitive layer is formed by adding an infrared-absorbing and UV-blocking substance, such as carbon black, to a water-soluble or water-dispersible binder. The infrared-sensitive layer, however, does not have crosslinked structures, and is, accordingly, brittle against external flaws. It is therefore necessary to pay attention to handling the material after peeling off the protective layer.

Another method has also been proposed in which the image mask is formed by irradiating with infrared laser light a photosensitive letterpress printing plate precursor including a photosensitive resin layer, a film layer, and an infrared-sensitive layer on a substrate (see, for example, EP Patent Application Publication No. 1152296 (column 26)). In this method, the entire surface of the printing plate precursor is exposed to ultraviolet light through the resulting image mask, and then the image mask is peeled off and removed together with the film layer, followed by water development to obtain a letterpress printing plate. This method does not allow the constituents of the infrared-sensitive layer of the image mask to contaminate the developer and the waste developer is easy to treat, advantageously. However, if the film layer between the photosensitive resin layer and the infrared-sensitive layer has a large thickness, the large thickness easily causes ultraviolet light to curve or disperse. Consequently, if a less directional ultraviolet light source is used, the resulting image may become large undesirably.

In view of the above-described disadvantages, the object of the present invention is to provide a photosensitive resin printing plate precursor capable of forming a protruding relief pattern without using any original pattern film, a method for producing the same, and a method for producing a letterpress printing plate using the same.

DISCLOSURE OF INVENTION

In order to overcome the disadvantages, the present invention provides a photosensitive resin printing plate precursor having the following structure:

the "photosensitive resin printing plate precursor comprising, on a support in this order, a photosensitive resin layer (A) containing a water-soluble or water-dispersible resin and an ultraviolet-curable monomer; a water-insoluble heat-sensitive mask layer (C) containing an infrared-absorbing material".

In addition, a method for producing a photosensitive resin printing plate precursor is provided which is as follows:

the "method for producing a photosensitive resin printing plate precursor, the method comprising the steps of:
(i) forming a photosensitive resin sheet by depositing a photosensitive resin layer (A) on a substrate;
(ii) forming a heat-sensitive mask element including a water-insoluble heat-sensitive mask layer (C); and
(iii) laminating the surface of the photosensitive resin layer (A) of the photosensitive resin sheet to the heat-sensitive mask element."

Furthermore, a method for producing a letterpress printing plate is provided which is as follows:

the "method for producing a letterpress printing plate, the method comprising the steps of:
(1) preparing the photosensitive resin printing plate precursor of the present invention;
(2) forming an image mask (C') by imagewise irradiating the heat-sensitive mask layer (C) with infrared laser;
(3) exposing through the image mask (C') to ultraviolet light to form a latent image on the photosensitive resin layer (A); and
(4) removing the image mask (C') and portions unexposed to ultraviolet light of the photosensitive resin layer (A) by development with a water-based liquid."

BEST MODE FOR CARRYING OUT THE INVENTION

The present invention easily provides a photosensitive resin printing plate precursor capable of forming a protruding relief pattern without using any original pattern film. The invention can be applied not only to letterpress printing plates which have protruding reliefs, but also to flexographic printing plates, intaglio printing plates, lithographic printing plates, and stencil printing plates without limiting the applications to these, as long as a photosensitive resin is used.

Embodiments of the present invention will now be described.

The photosensitive resin printing plate precursor of the present invention has a layered structure formed by depositing on a support in this order, a photosensitive resin layer (A) and a heat-sensitive mask layer (C).

The photosensitive resin layer (A) of the present invention must contain a water-soluble or water-dispersible resin and an ultraviolet-curable monomer. The layer (A) is cured by exposing to ultraviolet light, preferably having a wavelength of 300 to 400 nm. The photosensitive resin layer (A) is formed of a photosensitive resin composition in, preferably, a sheet with a thickness of 0.1 to 10 mm.

The above-mentioned photosensitive resin composition contains a water-soluble or water-dispersible resin and an ultraviolet-curable monomer, and preferably further contains a photopolymerization initiator.

The water-soluble or water-dispersible resin of the present invention functions as a carrier resin for retaining the form of the photosensitive resin composition which turns out a solid state, and allows the photosensitive resin layer (A) to be developed in water. Such resins include, for example, polyvinyl alcohol, polyvinyl acetate, partially saponified polyvinyl acetate (partially saponified polyvinyl alcohol), cellulose resins, acrylic resins, polyamide resins having a hydrophilic group such as polyethylene oxide, ethylene/vinyl acetate copolymers, and their modified forms. Among these, preferred are polyvinyl alcohol, partially saponified polyvinyl alcohol, polyamide resins having a hydrophilic group, and their modified forms.

The ultraviolet-curable monomer can generally be crosslinked by radical polymerization, and is not particularly limited as long as it is capable of being crosslinked by radical polymerization. Examples of the ultraviolet-curable monomer include compounds having a single ethylenically unsaturated bond, for example, (meth)acrylates having a hydroxy group, such as 2-hydroxyethyl (meth)acrylate, 2-hydroxypropyl (meth)acrylate, 2-hydroxybutyl (meth)acrylate, 3-chloro-2-hydroxypropyl (meth)acrylate, and β-hydroxy-β'-(meth)acryloyloxyethyl phthalate; alkyl (meth)acrylates, such as methyl (meth)acrylate, ethyl (meth)acrylate, propyl (meth)acrylate, butyl (meth)acrylate, isoamyl (meth)acrylate, 2-ethylhexyl (meth)acrylate, lauryl (meth)acrylate, and stearyl (meth)acrylate; cycloalkyl (meth)acrylates, such as cyclohexyl (meth)acrylate; haloalkyl (meth)acrylates, such as chloroethyl (meth)acrylate and chloropropyl (meth)acrylate; alkoxyalkyl (meth)acrylate, such as methoxyethyl (meth)acrylate, ethoxyethyl (meth)acrylate, and butoxyethyl (meth)acrylate; phenoxyalkyl (meth)acrylates, such as phenoxyethyl acrylate and nonylphenoxyethyl (meth)acrylate; alkoxyalkylene glycol (meth)acrylates, such as ethoxydiethylene glycol (meth)acrylate, methoxytriethylene glycol (meth)acrylate, and methoxydipropylene glycol (meth)acrylate; (meth)acrylamides, such as (meth)acrylamide, diacetone (meth)acrylamide, and N,N'-methylene-bis-(meth)acrylamide; 2,2-dimethylaminoethyl (meth)acrylate; 2,2-diethylaminoethyl (meth)acrylate; N,N-dimethylaminoethyl (meth)acrylamide; and N,N-dimethylaminopropyl (meth)acrylamide. The ultraviolet-curable monomers also include compounds having at least two ethylenically unsaturated bonds, for example, polyethylene glycol di(meth)acrylates, such as diethylene glycol di(meth)acrylate; polypropylene glycol di(meth)acrylates, such as dipropylene glycol di(meth)acrylate; trimethylolpropane tri(meth)acrylate; pentaerythritol tri(meth)acrylate; pentaerythritol tetra(meth)acrylate; glycerol tri(meth)acrylate; polyvalent (meth)acrylates prepared by adding a compound having an ethylenically unsaturated bond and an activated hydrogen, such as an unsaturated carboxylic acid or an unsaturated alcohol, to ethylene glycol diglycidyl ether; polyvalent (meth)acrylates prepared by addition reaction of an unsaturated epoxy compound, such as glycidyl (meth)acrylate, with a compound having an activated hydrogen, such as a carboxylic acid or an amine; polyvalent (meth)acrylamides, such as methylene-bis-(meth)acrylamide; and polyvalent vinyl compounds, such as divinyl benzene.

The photopolymerization initiator suitably used in the present invention is not particularly limited, as long as it can polymerize polymerizable unsaturated carbon-carbon bonds with light. Among others preferred are compounds capable of producing radicals by self-cleavage or hydrogen removal, such as benzoin alkyl ethers, benzophenones, anthraquinones, benzils, acetophenones, and diacetyls.

In order to enhance the compatibility and flexibility, another constituent, for example, a polyvalent alcohol may be added to the photosensitive resin composition. Such polyvalent alcohols include ethylene glycol, diethylene glycol, triethylene glycol, polyethylene glycol, glycerin, trimethylol propane, and trimethylol ethane. A known polymerization inhibitor may also be added to enhance the thermal stability. Preferred polymerization inhibitors include phenols, hydroquinones, and catechols. Other additives may also be added, such as dye, pigment, surfactant, UV absorber, perfume, and antioxidant.

The process for producing the photosensitive resin layer (A) from the photosensitive resin composition is not particularly limited. For example, after a carrier resin is dissolved in a solvent, a UV-curable monomer and a photopolymerization initiator are added to the solution and the mixture is sufficiently stirred to yield a solution of the photosensitive resin composition. The resulting solution is subjected to removal of the solvent, and then melt-extruded onto a support which is, preferably, coated with an adhesive. Alternatively, the solution in which part of the solvent remains may be melt-extruded onto a support coated with an adhesive, and then the remaining solvent is air-dried with time to yield the photosensitive resin layer (A).

The material of the support used in the present invention is not particularly limited, but preferably has dimensional stability. Such support materials include, for example, metal plates, such as of steel, stainless steel, and aluminium; plastic sheets, such as of polyester; and synthetic rubber sheets, such as of styrene-butadiene rubber.

The heat-sensitive mask layer (C) used in the present invention has the following functions: (1) the mask layer efficiently absorbs infrared laser light to generate heat, so that the heat momentarily causes a part or the entirety of the mask layer to evaporate or ablate, thereby providing a difference in optical density between laser irradiated and no-irradiated areas, that is, reducing the optical density in the irradiated areas; (2) the mask layer essentially blocks ultraviolet light.

The heat-sensitive mask layer (C) is a water-insoluble heat-sensitive layer containing an infrared-absorbing material. Preferably, the layer (C) further contains a pyrolyzable compound capable of being evaporated or ablated by heat and a UV-absorbing material having a function to block ultraviolet light, in addition to the infrared-absorbing material, which absorbs infrared laser light to convert the light into heat.

Having a function to block ultraviolet light herein means that the optical density of the heat-sensitive mask layer (C) is 2.5 or more, preferably 3.0 or more. In general, optical density is represented by D and defined by the following equation:

$$D=\log_{10}(100/T)=\log_{10}(I_0/I)$$

(where T represents transmittance (unit: %); $I_0$ represents intensity of incident light for measuring transmittance; and I represents transmitted light intensity).

The optical density may be derived from a measured transmitted light intensity with the incident light intensity set constant, or derived from a measured incident light intensity required to reach a transmitted light intensity. In the present invention, the optical density refers to a value derived from the former, that is, transmitted light intensity.

The optical density can be measured by use of an orthochromatic filter and a Macbeth transmission densitometer TR-927 (manufactured by Kollmorgen Instruments Corp.).

The infrared-absorbing material is not particularly limited, as long as it can absorb infrared light and convert the light into heat. Examples of the infrared-absorbing material include: black pigments, such as carbon black, aniline black, and cyanine black; green pigments, such as phthalocyanines and naphthalocyanine; rhodamine dyes; naphthoquinone dyes; polymethine dyes; diimonium salts; azoimonium dyes; chalcogen dyes; carbon graphite; iron powder; diamine metal complexes; dithiol metal complexes; phenolthiol metal complexes; mercaptophenol metal complexes; arylaluminium metal salts; crystal water-containing inorganic compounds; copper sulfate; chromium sulfide; silicates; metal oxides, such as titanium oxide, vanadium oxide, manganese oxide, iron oxide, cobalt oxide, and tungsten oxide; hydroxides and sulfates of these metals; and metal powders, such as those of bismuth, tin, tellurium, iron, and aluminium.

Among these preferred is carbon black, from the viewpoint of photothermal conversion efficiency, cost efficiency, and ease of handling, and further ultraviolet absorption described later. Carbon black is classified into furnace black, channel black, thermal black, acetylene black, lampblack, and others, according to the manufacturing process. Among these, furnace black is preferably used because it has commercially available various types in, for example, grain size and is commercially inexpensive.

The infrared-absorbing material is used preferably in an amount of 2 to 75 percent by weight, more preferably 5 to 70 percent by weight, relative to the entire weight of the heat-sensitive mask layer (C). An amount of 2 percent by weight or more leads to efficient photothermal conversion, and an amount of 75 percent by weight or less prevents the lack of other constituents which is likely to cause the heat-sensitive mask layer (C) to be scratched.

Examples of the pyrolyzable compound used in the layer (C) include ammonium nitrate, potassium nitrate, sodium nitrate, nitro compounds such as nitrocellulose, organic peroxides, polyvinyl pyrrolidone, azo compounds, diazo compounds, hydrazine derivatives, and the metals and metal oxides listed in the section of the infrared-absorbing material. Preferably, macromolecular compounds are used, such as polyvinyl pyrrolidone and nitrocellulose, from the viewpoint of, for example, easy application of solution.

In the use of nitrocellulose, the viscosity of nitrocellulose is preferably 1/16 to 1 second and more preferably 1/8 to 1/2 second when the viscosity is measured in accordance with the method specified in ASTM D301-72. The viscosity corresponds to the polymerization degree of nitrocellulose, and a low viscosity refers to a low polymerization degree. If the viscosity is 1/16 seconds or more, the polymerization degree of nitrocellulose becomes so high as to prevent scratches in the surface of the heat-sensitive mask layer (C); if the viscosity is 1 second or less, inconvenience in handling resulting from high viscosity is prevented.

Nitrocellulose is liable to generate harmful NOx gas when it is pyrolyzed. If the heat-sensitive mask layer (C) contains nitrocellulose, it is necessary that the plate setter for drawing a mask pattern with an infrared laser is directly equipped with an air-collecting unit for drawing generated NOx and a unit for decomposing the NOx into harmless compounds. Accordingly, the plate setter comes to a large size and becomes expensive, disadvantageously.

This disadvantage can be solved by use of a pyrolyzable compound containing no NOx source, such as the nitro group.

Acrylic resin is relatively easy to pyrolyze and provide no fear of generating NOx because it contains no nitrogen atom. Acrylic resin is therefore preferably used as an alternative pyrolyzable compound to nitrocellulose. In general, acrylic resin has a pyrolysis temperature of 190 to 250° C. If the prevention of NOx generation is primarily intended, it is preferable that the heat-sensitive mask layer (C) do not substantially contain nitrocellulose. Not substantially containing nitrocellulose means that the nitrocellulose content in the composition of the heat-sensitive mask layer (C) is 2 percent by weight or less. This is because a nitrocellulose content of 2 percent by weight or less reduces the amount of NOx generated to such a level as does not cause environmental health problems.

Acrylic resin is a polymer or copolymer of at least one monomer selected from the group consisting of acrylic acids, methacrylic acids, acrylates, and methacrylates.

Since mass transfer to the underlying photosensitive resin layer (A) can be prevented by use of an acrylic resin insoluble in water and alcohol, water/alcohol-insoluble acrylic resins are more preferably used.

The pyrolyzable compound is used in an amount of, preferably, 80 percent by weight or less, more preferably 15 to 60 percent by weight, relative to the entire composition of the heat-sensitive mask layer (C). Use of 80 percent by weight or less of pyrolyzable compound prevents the occurrence of difficulty in pyrolyzing the pyrolyzable compound, resulting from the decrease in amount of a photothermal conversion material described below.

The UV-absorbing material suitably used in the layer (C) is not particularly limited, but is preferably a compound having an absorption band in the region of 300 to 400 nm. Examples of such compounds include benzotriazole compounds, triazines, benzophenone compounds, carbon black, and the metals and metal oxides listed in the section of the infrared-absorbing material. Among these preferred is carbon black because it exhibits absorption in the region of infrared as well as in the region of ultraviolet and functions as a photothermal conversion material.

The UV-absorbing material is used preferably in an amount of 0.1 to 75 percent by weight, more preferably 1 to 50 percent by weight, relative to the entire composition of the heat-sensitive mask layer (C). Use of at least 0.1 percent by weight of UV-absorbing material provides an optical density required, and use of 75 percent by weight or less of UV-absorbing material prevents lack of other constituents, which is likely to cause the heat-sensitive mask layer (C) to be scratched.

The heat-sensitive mask layer (C) is deposited on the photosensitive resin layer (A) directly or with an adhesion-adjusting layer (B) their between. The photosensitive resin layer (A) is constituted of a so-called hydrophilic composition containing a water-soluble or water-dispersible resin. If the adhesion-adjusting layer (B), which will be described later, is also constituted of a so-called hydrophilic composition containing a water-soluble or water-dispersible resin, a heat-sensitive mask layer (C) constituted of a hydrophilic composition causes mass transfer between the layers to degrade the intrinsic function of each layer. For example, if an monomer of the photosensitive resin layer (A) transfers into the heat-sensitive mask layer (C), the laser ablation characteristics of the heat-sensitive mask layer (C) are degraded; if the photosensitive resin layer (A) is contaminated with the UV-absorbing material, the photosensitive resin layer cannot be cured by ultraviolet light.

The heat-sensitive mask layer (C) used in the present invention, therefore, needs to have hydrophobicity. Hydrophobicity herein refers to insolubility in water, that is, the heat-sensitive mask layer (C) has characteristics not allowing development in water independently. In case of using metals or metal oxides as the heat-sensitive layer, these are intrinsically hydrophobic. But in case of using organic materials, such as carbon black, it is necessary to take measures. The approach for giving water insolubility is not particularly limited. For example, the entire composition of heat-sensitive mask layer (C) may be composed of hydrophobic constituents, or the layer may be crosslinked by using a curable resin as a binder. The latter approach is preferable because, in this approach, by increasing the molecular weight of constituents in the heat-sensitive mask layer (C), the mass transfer between the layers can be made more difficult. This approach also produces the effect of giving scratch resistance to the surface of the heat-sensitive mask layer (C), advantageously. Specifically, the scratch resistance is preferably such that no scratch penetrates through the heat-sensitive mask layer (C) even by five reciprocations, more preferably ten reciprocations, of rubbing the surface of the heat-sensitive mask layer (C), with a white cotton cloth wetted with water to which a load of 500 g (the weight of the frictionizer: 200 g; additional weight: 300 g) is applied with a color fastness rubbing tester II specified in JIS L 0823.

In the use of a curable resin as a binder, the method for curing the resin is not particularly limited, but curing by light is difficult or inefficient because the heat-sensitive mask layer (C) absorbs ultraviolet light. So curing by heat is preferable. Thermosetting resins acting as the binder include, for example, combinations of at least one compound selected from the group consisting of multifunctional isocyanates and multifunctional epoxy compounds and at least one compound selected from the group consisting of urea-based resins, amine-based compounds, amide-based compounds, hydroxy group-containing compounds, carboxylic compounds, and thiol-based compounds.

Multifunctional isocyanates need to be cured at high temperature because it is difficult to complete the reaction in a short time. However, if nitrocellulose is used as the pyrolyzable compound, it is not permitted to be cured at 180° C. or more because it pyrolyze at 180° C. For crosslinking, therefore, a combination is preferably applied which is constituted of a multifunctional epoxy compound and at least one compound selected from the group consisting of urea-based resins, amine-based compounds, amide-based compounds, hydroxy group-containing compounds, carboxylic compounds, and thiol-based compounds.

The multifunctional epoxy compounds include, for example, bisphenol A-type epoxy resins, bisphenol F-type epoxy resins, and glycidyl ether-type epoxy resins.

The urea-based resins include butylated urea resins, butylated melamine resins, butylated benzoguanamine resins, butylated urea-melamine cocondensed resins, aminoalkyd resins, iso-butylated melamine resins, methylated meminine resins, hexamethoxymethylolmelamine, methylated benzoguanamine resins, and butylated benzoguanamine resins.

The amine-based compounds include diethylenetriamine, triethylenetriamine, tetraethylenepentamine, diethylaminopropylamine, N-aminoethylpiperazine, meta-xylenediamine, meta-phenylenediamine, diaminodiphenylmethane, diaminodiphenylsulfone, and isophorone diamine.

The amide-based compounds include polyamide-based curing agents used for curing epoxy resins and dicyandiamide. The hydroxy group-containing compounds include phenol resins and polyvalent alcohols. The thiol-based compounds include polyvalent thiols.

Preferred carboxylic acids include phthalic acid, hexahydrophthalic acid, tetrahydrophthalic acid, dodecynylsuccinic acid, pyromellitic acid, chloren acid, maleic acid, fumaric acid, and their anhydrides.

A curable resin of a single constituent may be used as alternative to the curable resin of plural constituents. Such curable resins of a single constituent include epoxy resins, melamine resins, urethane resins, crosslinkable polyester resins, and crosslinkable polyamide resins. These resins may be used in combination.

The thermosetting resin is used in an amount of preferably 10 to 75 percent by weight, more preferably 30 to 60 percent by weight, relative to the entire composition of the heat-sensitive mask layer (C). Ten percent by weight or more of thermosetting resin provides a crosslinked structure sufficient to ensure water-insolubility, and 75 percent by weight or less of the thermosetting resin efficiently allows laser ablation of the heat-sensitive mask layer (C).

If a pigment, such as carbon black, is used as the infrared-absorbing material, a plasticizer, a surfactant, or a dispersant may be added so that the pigment is easy to disperse.

The method for forming the heat-sensitive mask layer (C) is not particularly limited. For example, vapor deposition or sputtering may be adopted in use of a metal oxide; a composition of the heat-sensitive mask layer, which may be used as it is or be dissolved in a solvent, may be applied by coating and subsequently cured by heat, in use of an organic material, such as carbon black.

The heat-sensitive mask layer (C) formed by coating has a thickness of preferably 0.5 to 10 μm, more preferably 1 to 3 μm. A thickness of 0.5 μm or more can make it difficult to scratch the surface of the layer, prevent leakage of light, and provide a certain level of optical density. Furthermore, the formation of such a thickness does not require any advanced application technique. A thickness of 10 μm or less does not require high energy for ablating the heat-sensitive mask layer (C), and is thus advantageous in costs.

The heat-sensitive mask layer (C) formed by vapor deposition or sputtering of a metal or a metal oxide is preferably thin, as long as high optical density is ensured. The thickness of a thin layer affects the sensitivity. Specifically, an excessively large thickness requires additional energy for vaporizing or melting the thin layer, and accordingly the ablation sensitivity of the heat-sensitive mask layer (C) is degraded. Thus, the thickness of the thin layer is preferably 100 nm or less, more preferably 2 to 100 nm, and particularly preferably 4 to 20 nm. Even a thickness of less than 2 nm may reduce the sensitivity.

Preferably, vacuum vapor deposition, which is one type of vapor deposition, is adopted. Specifically, a metal and carbon are heated to vaporize in a container of a reduced pressure of $10^{-4}$ to $10^{-7}$ mmHg, and deposited into a thin film on a substrate.

For sputtering, a direct or alternating voltage is applied to a pair of electrodes to cause glow discharge in a container of a reduced pressure of, for example, $10^{-1}$ to $10^{-3}$ mmHg, and thus a thin film is formed on a substrate by a sputtering phenomenon at the cathode, or at the grounding electrode in the case where an alternating voltage is applied.

Such a thin film having a high optical density required in the present invention is typically a carbon thin film. The carbon thin film herein is amorphous, different from so-called diamond thin films or graphite thin films. The amorphous carbon thin film can be selectively produced by general vacuum-vapor deposition, such as ion beam vapor deposition and ionized vapor deposition; or sputtering, such as ion beam sputtering.

The carbon thin film is preferably formed by either vacuum vapor deposition or sputtering.

In vacuum vapor deposition for forming the carbon thin film, preferably, carbon is heated to vaporize in a container of a reduced pressure of, for example, $10^{-4}$ to $10^{-7}$ mmHg, and deposited on the surface of a substrate. It is preferable that carbon be heated at an appropriate temperature and deposited taking a long time, because the melting point of carbon is as high as 3923 K.

In sputtering for forming the carbon thin film, preferably, a direct or alternating voltage is applied to a pair of electrodes to cause glow discharge in a container of a reduced pressure of, for example, $10^{-1}$ to $10^{-3}$ mmHg, and thus the thin film is formed on a substrate by a sputtering phenomenon at the cathode. By this method, even carbon, which has a high melting point, can be relatively easily formed into a thin film.

In addition to the carbon thin film, metal thin films can serve as the heat-sensitive mask layer (C). Exemplary metal thin films are made of, but not limited to, tellurium, tin, antimony, gallium, magnesium, polonium, selenium, thallium, zinc, aluminum, silicon, germanium, tin, copper, iron, molybdenum, nichrome, indium, iridium, manganese, lead, phosphorus, bismuth, nickel, titanium, cobalt, rhodium, osnium, mercury, barium, palladium, bismuth, and compounds listed in Japanese Examined Patent Application Publication No. 41-14510, such as silicon carbide, boron nitride, boron phosphide, aluminium phosphide, alloys of antimony and aluminum, alloys of gallium and phosphorus, and alloys of gallium and antimony. Among these preferred are tellurium, tin, antimony, gallium, magnesium, polonium, selenium, thallium, zinc, bismuth, and aluminium.

It is preferable that the metal used for the layer (C) be less lustrous, from the viewpoint of sensitivity, because highly lustrous metals reflect laser light large at the surface.

Any metal may be used in the layer (C), as long as the metal can be partially or entirely vaporized or melted instantaneously and has a melting point of 2000 K or less. It takes a long time to vaporize or melt a metal having a melting point of more than 2000 K even by laser exposure, and consequently the ablation sensitivity of the layer (C) is degraded. More preferably, the melting point is 1000 K or less. Specifically, such metals include preferably tellurium, tin, antimony, gallium, magnesium, polonium, selenium, thallium, zinc, bismuth, and aluminum, more preferably tellurium (melting point: 449.8° C.), tin (melting point: 232° C.), zinc (melting point: 419.5° C.), and aluminum (melting point: 660.4° C.). These metals are particularly preferable because thin films made of these metals are easily vaporized or melted by heat of laser exposure.

Since alloys of two or three metals selected from the above-listed metals have low melting points and are sensitive, such alloys are particularly suitable for the layer (C). Specifically, such alloys are constituted of preferably tellurium and tin; tellurium and antimony; tellurium and gallium; tellurium and bismuth; and tellurium and zinc, more preferably tellurium and zinc; and tellurium and tin. Alloys of three constituents include preferably those of tellurium, tin, and zinc; tellurium, gallium, and zinc; tin, antimony, and zinc; and tin, bismuth, and zinc, more preferably tellurium, tin, and zinc; and tin, bismuth, and zinc.

The metal thin film may be formed by any process, but preferably by vacuum vapor deposition or sputtering.

A thin film containing carbon and a metal may also be used as the heat-sensitive mask layer (C). By simultaneous vapor deposition or sputtering of carbon and a metal, the optical density of the thin film is increased, so that the thin film more easily absorbs infrared laser light advantageously. In this instance, various types of metal may be used. The metal or alloy used in this case is not particularly limited, as long as it allows vapor deposition or sputtering. Preferably, the metal has a melting point of 2000 K or less, and more preferably 1000 K or less. A metal having a melting point of more than 2000 K does not easily form images even by simultaneous vapor deposition or sputtering of carbon and the metal.

In the simultaneous vapor deposition or sputtering of carbon and the metal, the carbon content in the resulting thin film is preferably 10 percent by weight or more, and more preferably 30 percent by weight or more. A carbon content of less than 10 percent by weight reduces the absorption of infrared laser light, and consequently the sensitivity is likely to deteriorate.

An adhesion-adjusting layer (B) may be provided between the photosensitive resin layer (A) and the heat-sensitive mask layer (C). The adhesion-adjusting layer (B) enhances the adhesion between the layer (A) and the layer (C) when the adhesion between the layer (A) and the layer (C) is weak, and reduces the adhesion between the layer (A) and the layer (C) when the adhesion between these layers is so strong as to negatively affect the laser ablation characteristics of the layer (C). In addition, the adhesion-adjusting layer (B) certainly prevents mass transfer between the layer (A) and the layer (C), and laser ablation of the photosensitive resin layer (A).

If adhesion between the layer (A) and the layer (C) is excessively strong, either or both of the layers may be cohesive or contain a functional group contributing to the adhesion. In such cases, the adhesion-adjusting layer (B) can be provided to reduce the adhesion between the layers. Against highly cohesive layers (A) and (C), a resin used for preventing cohesiveness, such as polyvinyl alcohol or cellulose, can be used to accomplish the purpose. Against the layers containing a functional group contributing to the adhesion, a resin less interacting with the functional group can be used.

If the adhesion-adjusting layer (B) is provided in order to enhance the adhesion between the layer (A) and the layer (C), the layer (B) is preferably formed of a compound having both a hydrophilic group and a hydrophobic group because the photosensitive resin layer (A) is hydrophilic and the heat-sensitive mask layer (C) is hydrophobic. Examples of such a compound include a resin prepared by introducing a hydroxy group to the water-insoluble resin used in the heat-sensitive mask layer (C); and an uncured form of the thermosetting resin used in the heat-sensitive mask layer (C).

The adhesion-adjusting layer (B) may be constituted of a water-soluble or water-dispersible resin from the viewpoint of water development, and preferably the water-soluble or water-dispersible resins listed in the section of the photosensitive resin layer (A) are suitably used. Specifically, preferred are polyvinyl alcohol, polyvinyl acetate, partially saponified polyvinyl acetate (partially saponified polyvinyl alcohol), cellulose resins, acrylic resins, polyamide resins having a hydrophilic group, such as polyethylene oxide, and ethylene/vinyl acetate copolymers. An additive, such as a surfactant, may be added to these resins. After depositing the adhesion-adjusting layer (B), the constituent of the adhesion-adjusting layer may be diffused into the photosensitive resin layer (A) to assimilate into the layer (A).

The thickness of the adhesion-adjusting layer (B) is preferably 15 µm or less, and more preferably 0.3 to 5 µm. A thickness of 15 µm or less can prevent ultraviolet exposure light from curving or diffusing at the adhesion-adjusting layer, thus allowing the formation of sharp relief patterns. An adhesion-adjusting layer (B) having a thickness of 0.3 µm or more is easy to form.

A protective layer (E) may be provided over the heat-sensitive mask layer (C). The layer (E) is used to protect the heat-sensitive mask layer (C) against external flaws. Preferably, the protective layer (E) may be made of a polymer film capable of being peeled off from the heat-sensitive mask layer (C). Examples of the protective layer (E) include films of polyester, polycarbonate, polyamide, fluoropolymer, polystyrene, polyethylene, and polypropylene. Alternatively, the layer (E) may be a release paper coated with silicone.

The thickness of the protective layer (E) is preferably 25 to 200 µm, and more preferably 50 to 150 µm. A thickness of 25 µm or more leads to easy handling and can protect the heat-sensitive mask layer (C) against external flaws; a thickness of 200 µm or less reduces the cost and leads to economical advantage, and the layer having such a thickness is easy to peel off.

The heat-sensitive mask layer (C) may be covered with a peel assist layer (D). Preferably, the layer (D) is disposed between the layer (C) and the layer (E). Preferably, the peel assist layer (D) makes it easy to peel off itself alone, only the protective layer (E), or both the protective layer (E) and the separation aid layer (D) from the photosensitive resin printing plate precursor. If the protective layer (E) is directly disposed on the heat-sensitive mask layer (C) with strong adhesion between these layers, the protective layer (E) may be difficult to peel off or be easily peeled off together with the heat-sensitive mask layer (C).

Preferably, the peel assist layer (D) is made of a material adhesive to the heat-sensitive mask layer (C) and less adhesive to the protective layer (E) to the extent that the protective layer (E) can be peeled off, or a material less adhesive to the heat-sensitive mask layer (C) to the extent that it can be peeled off from the heat-sensitive mask layer (C) and adhesive to the protective layer (E). The peel assist layer (D) may remain as the outermost layer on the heat-sensitive mask layer side after the peeling off of the protective layer (E). It is therefore preferable that the peel assist layer (D) is not cohesive from the viewpoint of handling, and is substantially transparent because ultraviolet exposure light runs through this layer.

Exemplary constituents of the peel assist layer (D) include polyvinyl alcohols, polyvinyl acetates, partially saponified polyvinyl alcohols, hydroxyalkyl celluloses, alkyl celluloses, and polyamide resins. Preferably, resins are used which mainly contain less cohesive constituents capable of being dissolved or dispersed in water. Among these, preferred are partially saponified polyvinyl alcohols having a degree of saponification of 60 to 99 mol %; and hydroxyalkyl celluloses and alkyl celluloses having an alkyl group with a carbon number in the range of 1 to 5, from the viewpoint of cohesiveness.

The layer (D) may further contain an infrared-absorbing material and/or a pyrolyzable material so as to be easily ablated. The above-listed infrared-absorbing material and pyrolyzable material materials can be used. The layer (D) may also contain a surfactant in order to enhance the coating characteristics and wettability.

The thickness of the peel assist layer (D) is preferably 6 μm or less, and more preferably 0.1 to 3 μm. A thickness of 6 μm or less does not negatively affect the laser ablation characteristics of the underlying heat-sensitive mask layer (C). The layer (D) having a thickness of 0.1 μm or more is easy to form.

If the protective layer (E) is peeled off from the photosensitive resin printing plate precursor at a speed of 200 mm/min, the peel strength per centimeter is preferably 0.5 to 20 g/cm, and more preferably 1 to 15 g/cm. A peel strength of 0.5 g/cm or more allows work without undesirable undesirable peeling of the protective layer (E), and a peel strength of 20 g/cm or less allows the protective layer (E) to be easily peeled off.

Preferred embodiments of the method for producing the photosensitive resin printing plate precursor of the present invention will now be described.

A first embodiment produces a printing plate precursor including the photosensitive resin layer (A), optionally the adhesion-adjusting layer (B), the heat-sensitive mask layer (C), the peel assist layer (D), and the protective layer (E) which are deposited in that order on a substrate. This precursor is produced by laminating a heat-sensitive mask sheet to a photosensitive resin sheet. The heat-sensitive mask sheet includes the layer (D), the layer (C), and optionally the layer (B) deposited by coating in that order on the protective layer (E). The photosensitive resin sheet includes the layer (A) deposited on the substrate. The lamination process is not particularly limited. For example, the heat-sensitive mask sheet may be laminated to the surface of the layer (A) or layer (B) swelled with water and/or alcohol; the photosensitive resin sheet and the heat-sensitive mask sheet may be laminated with a viscous liquid having a composition that is the same as or similar to the layer (A), injected between the two sheets; or the two sheets may be pressed with a pressing machine at room temperature or while being heated.

A second embodiment produces a printing plate precursor including the photosensitive resin layer (A), optionally the adhesion-adjusting layer (B), and the heat-sensitive mask layer (C) deposited in that order on a substrate. First, if the layer (B) is provided, a solution containing the constituent of the layer (B) is applied onto the surface of the photosensitive resin sheet prepared by depositing the photosensitive resin layer (A) on a substrate by the method described in the first embodiment, followed by drying. Then, the resulting layer is coated with a liquid in which the constituent of the heat-sensitive mask layer (C) is dissolved or dispersed, and the liquid is heated to cure.

Alternatively, the layer (C) and optionally the layer (B) are deposited in that order on a release paper by the same coating to prepare a heat-sensitive mask sheet, then the photosensitive resin sheet including the layer (A) deposited on a substrate is laminated to the heat-sensitive mask sheet such that the layer (A) comes into contact with the layer (B) or layer (C), and finally the release paper is removed. The removed release paper can be advantageously reused for the same purpose.

A third embodiment produced a printing plate precursor including the photosensitive resin layer (A), optionally the adhesion-adjusting layer (B), the heat-sensitive mask layer (C), and the peel assist layer (D) deposited in that order on a substrate. This printing plate precursor can be obtained by peeling off the protective layer (E) from the printing plate precursor produced in the first embodiment. In this instance, the peeled protective layer (E) can be reused advantageously.

A fourth embodiment produces a printing plate precursor including the photosensitive resin layer (A), optionally the adhesion-adjusting layer (B), the heat-sensitive mask layer (C), and the protective layer (E) deposited in that order on a substrate. This printing plate precursor is produced by laminating a heat-sensitive mask sheet including the layer (C) and the layer (B) deposited by coating in that order on the protective layer (E) to a photosensitive resin sheet including the layer (A) deposited on a substrate.

The photosensitive resin printing plate precursor prepared by the above-descried method results in a letterpress printing plate through the following process.

The method for producing a letterpress printing plate of the present invention include the steps of: (1) preparing the above-described photosensitive resin printing plate precursor; (2) forming an image mask (C') by imagewise irradiating the heat-sensitive mask layer (C) with infrared laser; (3) exposing through the resulting image mask (C') to ultraviolet light to form a latent image on the photosensitive resin layer (A); and (4) performing development with a water-based liquid to remove the image mask (C') and the portions unexposed to ultraviolet light of the photosensitive resin layer (A) and subsequently removing the developer by drying.

If the precursor includes the layer (E) or the layer (D) and layer (E), preferably, the image mask (C') is formed by imagewise irradiating the heat-sensitive mask layer (C) with infrared laser light, after removal of at least the layer (E). More preferably, the heat-sensitive mask layer (C) is imagewise irradiated with infrared laser light to form image mask (C') after removing only the layer (E) from the precursor including the layer (D) and the layer (E).

In the step of (2) forming an image mask (C') by imagewise irradiating the heat-sensitive mask layer (C) with infrared laser light, infrared laser light is switched on/off according to image data, and is irradiated to the heat-sensitive mask layer (C) while scanning the mask layer. The heat-sensitive mask layer (C) irradiated with the infrared laser light generates heat due to the action of the infrared-absorbing material. The heat decomposes the pyrolyzable compound to remove the heat-sensitive mask layer (C). Thus, laser ablation is performed. The optical density in the region subjected to the laser ablation is largely reduced, and the region becomes substantially transparent to ultraviolet light. By selectively performing laser ablation on the heat-sensitive mask layer (C) according to image data, the image mask (C') is formed which can provide a latent image on the photosensitive resin layer (A).

For the irradiation of infrared laser, a laser having an oscillation wavelength in the range of 750 to 3000 nm is used. Examples of such a laser include solid lasers, such as ruby lasers, alexandrite lasers, perovskite lasers, Nd-YAG lasers, and emerald glass lasers; semiconductor lasers, such as InGaAsP, InGaAs, and GaAsAl lasers; and dye lasers, such as rhodamine lasers. A fiber laser amplifying these light source may also be used. Among these preferred are semiconductor lasers because they have been downsized through the recent advances in technology and are more economically advantageous than other laser sources. In addition, Nd-YAG lasers, which are often used for dental and medical cares, are preferable because of their high power and economical advantage.

In the step of (3) exposing through the resulting image mask (C') to ultraviolet light to form a latent image on the photosensitive resin layer (A), the entire surface of the photosensitive resin printing plate irradiated with laser light is exposed to ultraviolet light, preferably having a wavelength of 300 to 400 nm, through the image mask (C') in which an image pattern has been formed with the laser, and thus the portions of the photosensitive resin layer (A) underlying the regions subjected to laser ablation of the image mask (C') are selectively cured.

Since ultraviolet light enters the photosensitive resin printing plate even from the sides during exposure, it is preferable that a cover not transmissive to ultraviolet light be provided over the side surfaces. Light sources achieving exposure to light having a wavelength of 300 to 400 nm include high-pressure mercury lamps, super-high-pressure mercury lamps, metal halide lamps, xenon lamps, carbon arc lamps, and chemical lamps. The portions exposed to ultraviolet light of the photosensitive resin layer (A) are turned insoluble or nondispersible in developer.

The step of (4) performing development with a water-based liquid to remove the image mask (C') and the portions unexposed to ultraviolet light of the photosensitive resin layer (A) may be carried out, for example, by developing the photosensitive resin layer (A) with a brush washer or a spray washer using a water-based developer capable of dissolving or dispersing the photosensitive resin layer (A). Consequently, the portions exposed to ultraviolet light are left to yield a letterpress printing plate having a relief pattern.

If the peel assist layer (D) remains, this layer is preferably removed in the step of (4), by development.

The water-based developer contains tap water, distilled water, or water as the primary constituent, and optionally an alcohol having a carbon number of 1 to 6. The primary constituent means that its content is 70 percent by weight or more. The water-based developer may further contain the constituents of the photosensitive resin layer (A), the adhesion-adjusting layer (B), the heat-sensitive mask layer (C), or the peel assist layer (D).

The image mask (C') is insoluble in water in order to enhance the scratch resistance, and is therefore insoluble in the developer containing water and alcohol. However, the image mask (C') can be physically removed by scrubbing with an rigid brush, for example, a PBT (polybutylene terephthalate) brush because it is a thin film, which is advantageous in the view of cost. In this case, by use of developing water having a relatively high temperature of 30° C. to 70° C., the image mask (C') can be efficiently removed.

Then, additional treatment may be applied if necessary. For example, the developer attached on the surface of the plate is dried, the photosensitive resin printing plate is additionally exposed to light, or the cohesiveness of the plate is eliminated.

The letterpress printing plate produced by the method of the present invention can be incorporated in a printing press and thus used suitably.

EXAMPLES

The present invention will be further described in detail with reference to Examples.

<Synthesis of Water-Soluble Polyamide Resin 1>

Acrylonitrile was added to both ends of polyethylene glycol having a number average molecular weight of 600, followed by hydrogen reduction to yield α, ω-diaminopolyoxyethylene. Melted and polymerized were 60 parts by weight of an equimolar salt of the α, ω-diaminopolyoxyethylene and adipic acid, 20 parts by weight of ε-caprolactam, and 20 parts by weight of an equimolar salt of hexamethylene diamine and adipic acid to yield water-soluble polyamide resin 1 having a relative viscosity (viscosity of 1 g of polymer dissolved in 100 mL of chloral hydrate, measured at 25° C.) of 2.50.

<Preparation of Coating Liquid Composition 1 for Photosensitive Resin Layer (A1)>

A three-neck flask equipped with a stirring paddle and a condenser tube was charged with: (a) 50 parts by weight of water-soluble polyamide resin 1; (b) 34 parts by weight of water; and (c) 22 parts by weight of ethanol. The mixture was heated with stirring at 90° C. for 2 hours to dissolve the water-soluble polyamide resin 1. After the solution was cooled to 70° C., (d) 1.5 parts by weight of glycidy memethacrylate ("Blemmer" G, produced by NOF Corporation) was added to the solution, followed by stirring for 30 minutes. Further added were (e) 8 parts by weight of glycerol dimethacrylate ("Blemmer" GMR, produced by NOF Corporation), (f) 24 parts by weight of 2-acroyloxyethyl-2-hydroxyethyl phthalate (HOA-MPE, produced by Kyoeisha Chemical Co., Ltd.), (g) 5 parts by weight of polyethylene glycol (PEG #400, produced by Lion Corporation), (h) 5 parts by weight of N,N,N',N'-tetra(2-hydroxy-3-methacroyloxypropyl)-m-xylenediamine, (i) 4 parts by weight of tetramethylolmethane triacrylate ("NK Ester" A-TMM-3, produced by Shinnakamura Chemical Industrial Co., Ltd.), (j) 1.3 parts by weight of benzyldimethyl ketal ("Irgacure" 651, produced by Ciba-Geigy), and (k) 0.01 part by weight of hydroquinone monomethyl ether. The mixture was stirred for 30 minutes to yield coating liquid composition 1 for a photosensitive resin layer (A1).

<Preparation of Coating Liquid Composition 2 for Adhesion-Adjusting Layer (B1)>

Water-soluble polyamide resin 1 synthesized above was dissolved in a mixed solvent of water/ethanol=50/50 (weight ratio) at 80° C. so that the solid content would be 15 percent by weight. Thus, coating liquid composition 2 for an adhesion-adjusting layer (B1) was obtained.

<Preparation of Coating Liquid Composition 3 for Heat-Sensitive Mask Layer (C1)>

A mixture of 25 parts by weight of "MA100" (carbon black, produced by Mitsubishi Chemical Corporation), 26 parts by weight of nitrocotton "SL-1" (nitrocellulose, produced by Asahi Chemical Industry Co., Ltd.), 6 parts by weight of plasticizer ATBC (tributyl acetylcitrate, produced by J-PLUS Co., Ltd.), and 30 parts by weight of "PM acetate" (propylene glycol monomethyl ether acetate, produced by Osaka Printing Ink MFG. Co., Ltd.) was prepared in advance, and then kneaded and dispersed with a three-roll mill to prepare a carbon black dispersion liquid. To the dispersion liquid were added 17 parts by weight of "Araldite" 6071 (epoxy resin, produced by Asahi-Ciba Limited), 24 parts by weight of "U-VAN" 2061 (melamine resin, produced by Mitsui Chemicals, Inc.), (g) 1 part by weight of "Light Ester" P-1M (phosphate monomer, produced by Kyoeisha Chemical Co., Ltd.), and (h) 600 parts by weight of methylisobutyl ketone, and the mixture was stirred for 30 minutes. Then, (d) "PM acetate" was added to the mixture so that the solid content would be 16 percent by weight. Thus, coating liquid composition 3 for a heat-sensitive mask layer (C1) was obtained.

<Preparation of Coating Liquid Composition 4 for Peel Assist Layer (D1)>

In a mixed solvent of water/ethanol=40/60 (weight ratio) was dissolved 100 parts by weight of polyvinyl alcohol having a degree of saponification of 91% to 94% ("GOHSE-NOL" AL-06, produced by Nippon Synthetic Chemical Industry Co., Ltd.) at 80° C. so that the solid content would be 10 percent by weight. Thus, coating liquid composition 4 for a peel assist layer (D1) was obtained.

<Preparation of Coating Liquid Composition 5 for Peel Assist Layer (D2)>

In a mixed solvent of water/ethanol=40/60 (weight ratio) were dissolved 100 parts by weight of polyvinyl alcohol having a degree of saponification of 91% to 94% ("GOHSE-NOL" AL-06, produced by Nippon Synthetic Chemical Industry Co., Ltd.) and 2 parts by weight of a infrared absorber ("PROJET" 825, produced by Avecia KK) at 80° C. so that the solid content would be 10 percent by weight. Thus, coating liquid composition 5 for a separation aid layer (D2) was obtained.

<Production of Photosensitive Resin Sheet 1>

Coating liquid composition 1 for the photosensitive resin layer (A1) was spread on a substrate of 250 μm thick polyester film "Lumirror" S10 (produced by Toray Industries Inc.) to which a polyester-based adhesive had been applied in advance, and was dried at 60° C. for 2 hours to yield photosensitive resin sheet 1 with a total thickness of 950 μm, including the thickness of the substrate. The thickness of photosensitive resin sheet 1 was obtained by disposing a spacer having a predetermined thickness on the substrate and by scraping out coating liquid composition 1 of the portion extending out of the spacer with a level metal straight edge.

<Production of Heat-Sensitive Mask Element 1>

A 100 μm thick polyester film "Lumirror" S10 (produced by Toray Industries Inc.) was used as the layer (E). Coating liquid composition 4 was applied onto the polyester film with a bar coater so that the thickness would be 0.5 μm after drying, and dried at 120° C. for 30 seconds to yield a composite of peel assist layer (D1)/protective layer (E).

Then, coating liquid composition 3 was applied onto the peel assist layer (D1) of the resulting composite with a bar coater so that the thickness would be 2 μm after drying, and dried at 140° C. for 20 seconds to yield heat-sensitive mask element 1, which is a composite of heat-sensitive mask layer (C1)/peel assist layer (D1)/protective layer (E). The optical density (orthochromatic filter, transmission mode) of heat-sensitive mask element 1 was 3.3.

<Production of Heat-Sensitive Mask Element 2>

Coating liquid composition 5 was applied onto a 100 μm thick polyester film "Lumirror" S10 (produced by Toray Industries Inc.) with a bar coater so that the thickness would be 0.5 μm after drying, and dried at 120° C. for 30 seconds to yield a composite of peel assist layer (D2)/protective layer (E).

Then, coating liquid composition 3 was applied onto the peel assist layer (D2) of the resulting composite with a bar coater so that the thickness would be 2 μm after drying, and dried at 140° C. for 20 seconds to yield heat-sensitive mask element 2, which is a composite of heat-sensitive mask layer (C1)/peel assist layer (D2)/protective layer (E). The optical density (orthochromatic filter, transmission mode) of heat-sensitive mask element 2 was 3.5.

<Production of Heat-Sensitive Mask Element 3>

Coating liquid composition 5 was applied onto a 100 μm thick polyester film "Lumirror" S10 (produced by Toray Industries) with a bar coater so that the thickness would be 1 μm after drying, and dried at 120° C. for 30 seconds to yield a composite of peel assist layer (D2)/protective layer (E).

Then, coating liquid composition 3 was applied onto the peel assist layer (D2) of the resulting composite with a bar coater so that the thickness would be 2 μm after drying, and dried at 140° C. for 20 seconds to yield a composite of heat-sensitive mask layer (C1)/peel assist layer (D2)/protective layer (E).

Further, coating liquid composition 2 was applied onto the heat sensitive layer (C1) with a bar coater so that the thickness would be 1 μm after drying, and dried at 120° C. for 30 seconds to yield heat-sensitive mask element 3, which is a composite of adhesion-adjusting layer (B1)/heat-sensitive mask layer (C1)/peel assist layer (D2)/protective layer (E). The optical density (orthochromatic filter, transmission mode) of heat-sensitive mask element 3 was 3.5.

Example 1

A mixed solvent of water/ethanol=70/30 percent by weight was applied onto the photosensitive resin layer (A1) of the above-described photosensitive resin sheet 1 with a bar coater #20 to swell the photosensitive resin layer (A1). Then, the photosensitive resin layer (A1) was pressed together with heat-sensitive mask element 1 with a roller such that the heat-sensitive mask layer (C1) of heat-sensitive mask element 1 came into contact with the photosensitive resin layer (A1), and allowed to stand for 1 week. Thus, photosensitive resin printing plate precursor 1 was completed which had the layered structure of substrate/photosensitive resin layer (A1)/heat-sensitive mask layer (C1)/peel assist layer (D1)/protective layer (E) deposited in that order.

After peel of the protective layer (E), the photosensitive resin printing plate precursor 1 was attached on an external drum type plate setter "CDI SPARK" (manufactured by Esko-Graphics NV), equipped with a fiber laser emitting light in the infrared region such that the substrate came into contact with the drum. A test pattern of a resolution of 156 lines per inch (including solid pattern regions, 1% to 99% half tone, 1 to 8 point fine lines, and 1 to 8 point reverse pattern regions) was drawn, so that the heat-sensitive mask layer (C1) was formed into an image mask (C1'). The heat-sensitive mask layer (C1) in the solid pattern was substantially ablated with laser light under the conditions of a laser power of 6 W and a drum rotational speed of 300 rpm, without negative effects of excessive laser power, such as laser excavation of the surface of the underlying photosensitive resin layer (A1) and deformation of the drawn pattern. In addition, the heat-sensitive mask layer (C1) was resistant to external flaws because of its crosslinked structure. This made it easy to handle the printing plate precursor in attaching on the plate setter. For evaluation of the scratch resistance of the heat-sensitive mask layer (C1), the unsheltered surface of printing plate precursor 1 from which the protective layer (E) had been peeled was rubbed with a white cotton cloth wetted with water to which a load of 500 g (the weight of the frictionizer: 200 g; additional weight: 300 g) was applied, with a color fastness rubbing tester (tester II specified in JIS L 0823, manufactured by Daiei Kagaku Seiki MFG. Co, Ltd.). Even after 10 reciprocations of rubbing the surface, there was no scratch penetrating through the black heat-sensitive mask layer (C1).

Then, the entire surface of the plate through the image mask (C1') was exposed to light (exposure: 900 mJ/cm$^2$) from a super-high-pressure mercury lamp (manufactured by ORC MFG. Co., Ltd.) having a light source in the ultraviolet region. Subsequently, development was performed in tap water of 25° C. for 1.5 minutes with a brush-type developing machine FTW430II (manufactured by Toray Industries Inc.) equipped with a PBT (polybutylene terephthalate) brush. Consequently, the peel assist layer (D1), the image mask (C1'), and the portion not exposed to ultraviolet light of the photosensitive resin layer (A1), which was covered with the image mask, were selectively developed to form a relief being the faithful negative of the image mask (C1'). Although the heat-sensitive mask layer (C1) itself was crosslinked and hydrophobic and was therefore insoluble in water, the layer (C1) was able to be developed finally by rubbing with an rigid brush because the thickness was set as small as 2 μm.

The resulting relief was composed of only the photosensitive resin layer (A1), containing no black image mask (C1'), and had a sharp shape. This is because the heat-sensitive mask layer (C1) is crosslinked and insoluble in water. The heat-sensitive mask layer (C1) and the hydrophilic photosensitive resin layer (A1) are maintained independently without mixing with each other.

Example 2

Photosensitive resin printing plate precursor 2 having the layered structure of substrate/photosensitive resin layer (A1)/heat-sensitive mask layer (C1)/peel assist layer (D2)/protective layer (E) deposited in that order was produced in the same manner as in Example 1 except that the heat-sensitive mask element used in Example 1 was replaced with heat-sensitive mask element 2. Drawing was performed at a power of 6 W and a drum rotational speed of 500 rpm in the same manner as in Example 1. As a result, the heat-sensitive mask layer (C1) in the region of solid pattern was substantially ablated with laser light, without negative effects of excessive laser power, such as laser excavation of the surface of the underlying photosensitive resin layer (A1) and deformation of the drawn pattern. Since the peel assist layer (D2) overlying the heat-sensitive mask layer (C1) contained an infrared absorber, the peel assist layer (D2) became easy to ablate with laser light. Accordingly, it becomes possible to draw a pattern image at a higher drum rotational speed than that in Example 1 (that is, at a lower laser power per spot). Also, exposure with a super-high-pressure lamp and development with a brush-type developing machine were performed in the same manner as in Example 1, and thus a sharp relief was formed.

Example 3

A mixed solvent of water/ethanol=70/30 percent by weight was applied onto the photosensitive resin layer (A1) of the above-described photosensitive resin sheet 1 with a bar coater #20 to swell the photosensitive resin layer (A1). Then, the photosensitive resin (A1) was pressed together with heat-sensitive mask element 3 with a roller such that the adhesion-adjusting layer (B1) of heat-sensitive mask element 3 came into contact with the photosensitive resin layer (A1), and allowed to stand for 1 week. Thus, photosensitive resin printing plate precursor 3 was completed which had the layered structure of substrate/photosensitive resin layer (A1)/adhesion-adjusting layer (B1)/heat-sensitive mask layer (C1)/peel assist layer (D2)/protective layer (E) deposited in that order. Drawing at a power of 6 W and a drum rotational speed of 500 rpm was able to be performed for the resulting printing plate precursor as same as in Example 2.

Exposure with a super-high-pressure lamp and development with a brush-type developing machine were performed in the same manner as in Example 1. Since the adhesion-adjusting layer (B1) was formed of the water-soluble polyamide resin used in the photosensitive resin layer (A1), the adhesion-adjusting layer (B1) was united with the photosensitive resin layer (A1). The hydrophilic adhesion-adjusting layer (B1) and the water-insoluble heat-sensitive mask layer (C1) were not mixed with each other, and thus the relief had a sharp shape.

<Preparation of Coating Liquid Composition 6 for Adhesion-Adjusting Layer (B2)>

(a) 2 Parts by weight of partially saponified polyvinyl alcohol ("Mowiol" 4-80, produced by Hoechst) was dissolved in (b) 40 parts by weight of water to yield coating liquid composition 6 for an adhesion-adjusting layer (B2).

<Preparation of Coating Liquid Composition 7 for Heat-Sensitive Mask Layer (C2)>

(a) 2 Parts by weight of carbon black ("Printex" U, produced by Degussa), (b) 8 parts by weight of partially saponified polyvinyl alcohol (KP205, produced by Kuraray Co., Ltd.), (c) 20 parts by weight of n-propanol, and (d) 80 parts by weight of water were mixed and treated in a disperser "Ultra Turrax" for 2 hours to yield coating liquid composition 7 for a heat-sensitive mask layer (C2).

<Production of Heat-Sensitive Mask Element 4>

A 100 μm thick polyester film, "Lumirror" S10 (produced by Toray Industries Inc.) was used as the layer (E). Coating liquid composition 7 was applied onto the polyester film with a bar coater so that the thickness would be 6 μm after drying, and dried at 120° C. for 30 seconds to yield a composite of heat-sensitive mask layer (C2)/protective layer (E).

Coating liquid composition 6 was applied onto the heat-sensitive mask layer (C2) of the resulting composite with a bar coater so that the thickness would be 5 μm after drying, and dried at 120° C. for 20 seconds to yield heat-sensitive mask element 4, which is a composite of adhesion-adjusting layer (B2)/heat-sensitive mask layer (C2)/protective layer (E). The optical density (orthochromatic filter, transmission mode) of heat-sensitive mask element 4 was 3.4.

Comparative Example 1

A mixed solvent of water/ethanol=70/30 percent by weight was applied onto the photosensitive resin layer (A1) of the above-described photosensitive resin sheet 1 with a bar coater #20 to swell the photosensitive resin layer (A1). Then, the photosensitive resin (A1) was pressed together with heat-sensitive mask element 4 with a roller so that the adhesion-adjusting layer (B2) of heat-sensitive mask composite 4 came into contact with the photosensitive resin (A1), and allowed to stand for 1 week. Thus, photosensitive resin printing plate precursor 4 was completed which had the layered structure of substrate/photosensitive resin layer (A1)/adhesion-adjusting layer (B2)/heat-sensitive mask layer (C2)/protective layer (E) deposited in that order. Drawing with a plate setter, exposure with a super-high-pressure lamp and development with a brush-type developing machine were performed in the same manner as in Example 1. Since the heat-sensitive mask layer (C2) was formed of carbon black dispersed in a water-soluble partially saponified polyvinyl alcohol, the heat-sensitive mask layer was weak in film strength and liable to be scratched while the printing plate was handled. The scratch resistance of the heat-sensitive mask layer (C2) was evaluated in the same manner as in Example 1. As a result, only one reciprocation of rubbing produced a penetrating scratch. Once a scratch occurs in the heat-sensitive mask layer (C2), the scratched portion cannot block ultraviolet light, so that the portion where curing should be prevented will be cured. Thus, an undesired relief was formed, and which was not suitable for the printing plate. Since the heat-sensitive mask layer (C2) is developed in water, a water-soluble resin is used as a binder. Consequently, it was found that the adhesion-adjusting layer (B2) and the photosensitive resin layer (A1), which were also soluble in water, were contaminated with the constituent of the heat-sensitive mask layer (C2). The contamination of the photosensitive resin layer (A1) with the constituent of the heat-sensitive mask layer (C2) easily caused failure in curing the contaminated portions, thus resulting in an unsatisfactory relief.

<Synthesis of Water-Soluble Polyamide Resin 2>

A mixture of 10 parts by weight of ε-caprolactam, 90 parts by weight of a nylon salt of N-(2-aminoethyl)piperazine and adipic acid, and 100 parts by weight of water was placed in a stainless-steel autoclave. After the autoclave was purged with nitrogen gas, the mixture was heated at 180° C. for 1 hour, and then water was removed from the mixture to yield water-soluble polyamide resin 2.

<Synthesis of Modified Polyvinyl Alcohol 1>

A flask equipped with a condenser tube was charged with 50 parts by weight of partially saponified polyvinyl alcohol "GOHSENOL" KL-05 (degree of saponification: 78.5% to 82.0%, produced by Nippon Synthetic Chemical Industry Co., Ltd.), 2 parts by weight of succinic anhydride, and 10 parts by weight of acetone, and heated at 60° C. for 6 hours. Subsequently, the condenser tube was removed to vaporize the acetone. Then, purification was performed twice by eluting unreacted succinic anhydride with 100 parts by weight of acetone. The product was dried under reduced pressure at 60° C. for 5 hours to yield modified polyvinyl alcohol 1 which has an ester bond of succinic acid and a hydroxy group.

<Preparation of Coating Liquid Composition 8 for Photosensitive Resin Layer (A2)>

A three-neck flask equipped with a stirring paddle and a condenser tube was charged with: 7.5 parts by weight of water-soluble polyamide resin 2, 47.5 parts by weight of modified polyvinyl alcohol 1, 11 parts by weight of diethylene glycol, 38 parts by weight of water, and 44 parts by weight of ethanol. The mixture was heated with stirring at 110° C. for 30 minutes and subsequently 70° C. for 90 minutes to dissolve the polymer. Then, 3 parts by weight of "Blemmer" G (glycidyl methacrylate, produced by NOF Corporation) was added and the mixture was stirred at 70° C. for 30 minutes. Further added were 12 parts by weight of "Blemmer" GMR (methacrylic acid adduct of glycidyl methacrylate, produced by NOF Corporation), 5 parts by weight of "Light Ester" G201P (acrylic acid adduct of glycidyl methacrylate, produced by Kyoeisha Chemical Co., Ltd.), 6 parts by weight of "Epoxy Ester" 70PA (acrylic acid adduct of propylene glycol diglycidyl ether, produced by Kyoeisha Chemical Co., Ltd.), 5 parts by weight of "NK Ester" A-200 (diacrylate ester of polyethylene glycol having an average molecular weight of 200, produced by Shinnakamura Chemical Industrial Co., Ltd.), 0.1 part by weight of "Irgacure" 651 (benzyldimethyl ketal, produced by Ciba-Geigy), 1.5 parts by weight of "Irgacure" 184 (α-hydroxy ketone, produced by Ciba-Geigy), 0.01 part by weight of "Suminol Fast Cyanine Green G conc." (acid dye, Color index C. I.: Acid Green 25, produced by Sumitomo Chemical Co., Ltd.), 0.01 part by weight of "Direct Sky Blue 6B" (produced by Hamamoto Senryou KK), 0.05 part by weight of "FOAMASTER" (antifoaming agent, produced by San Nopco Limited), 0.015 part by weight of "TINUVIN" 327 (UV-absorber, produced by Ciba-Geigy), 0.2 part by weight of "TTP-44" (bis-(2-{2-ethoxyethoxycarbonyl)ethylthio}octylthiophosphine, produced by Yodo Kagaku Co., Ltd.), and 0.005 part by weight of "Q-1300" (ammonium N-nitrosophenylhydroxylamine, produced by Wako Pure Chemical Industries, Ltd.). The mixture was stirred for 30 minutes to yield mobile coating liquid composition 8 for a photosensitive resin layer (A2).

<Preparation of Adhesive-Coated Substrate 2>

A mixture of 260 parts by weight of "Vylon" 31SS (toluene solution of unsaturated polyester resin, produced by Toyobo Co., Ltd.) and 2 parts by weight of "PS-8A" (benzoin ethyl ether, produced by Wako Pure Chemical Industries, Ltd.) was heated at 70° C. for 2 hours and, then, cooled to 30° C. To the mixture was added 7 parts by weight of ethylene glycol diglycidyl ether dimethacrylate, followed by blending for 2 hours. Further, 25 parts by weight of "Coronate" 3015E (ethyl acetate solution of polyvalent isocyanate resin, produced by Nippon Polyurethane Industry Co., Ltd.) and 14 parts by weight of "EC-1368" (industrial adhesive, produced by 3M) were added to yield adhesive composition 1.

In a mixed solvent of 200 parts by weight of "SOLMIX" H-11 (alcohol mixture, Japan Alcohol Trading Co., Ltd.) and 200 parts by weight of water was dissolved 50 parts by weight of "GOHSENOL" KH-17 (polyvinyl alcohol having a degree of saponification of 78.5% to 81.5%, produced by Nippon Synthetic Chemical Industry Co., Ltd.) at 70° C. for 2 hours. Then, 1.5 parts by weight of "Blemmer" G (glycidyl methacrylate, produced by NOF Corporation) was added to the solution and blended for 1 hour. Further, to the mixture were added 3 parts by weight of (dimethylamino ethyl methacrylate)/(2-hydroxyethyl methacrylate)/(methacrylic acid) copolymer (produced by Kyoeisha Chemical Co., Ltd.), 5 parts by weight of "Irgacure" 651 (benzyldimethyl ketal, produced by Ciba-Geigy), 21 parts by weight of "Epoxy Ester" 70PA (acrylic acid adduct of propylene glycol diglycidyl ether, produced by Kyoeisha Chemical Co., Ltd.), and 20 parts by weight of ethylene glycol diglycidyl ether dimethacrylate. These materials were blended for 90 minutes and cooled to 50° C. Subsequently, 0.1 part by weight of "FLUORAD" TM FC-430 (produced by 3M) was added to the mixture and blended for 30 minutes to yield adhesive composition 2.

Adhesive (layer) composition 1 was applied onto 250 μm thick "Lumirror" T60 (polyester film, produced by Toray Industries) with a bar coater so that the thickness after drying would be 40 μm, and the solvent was removed in an oven of 180° C. for 3 minutes. Then, adhesive (layer) composition 2 was applied onto the resulting layer with a bar coater so that the thickness after drying would be 30 μm, followed by drying at 160° C. for 3 minutes to yield adhesive-coated substrate 2.

<Production of Photosensitive Resin Sheet 2>

Adhesive-coated substrate 2 was exposed to light of a super-high-pressure lamp at 1000 mJ/cm² from the adhesive-coated side. Then, coating liquid composition 8 for the photosensitive resin layer (A2) was spread on the adhesive-coated surface of adhesive-coated substrate 2, and was dried at 60° C. for 5 hours in an oven to yield photosensitive resin sheet 2 having a total thickness of about 900 μm, including the thickness of the substrate. The thickness of the photosensitive resin sheet 2 was controlled by disposing a spacer having a predetermined thickness on the substrate and by scraping out coating liquid composition 8 of the portion extending out of the spacer with a level metal straightedge.

<Preparation of Coating Liquid Composition 9 for Peel Assist Layer (D3)>

4 parts by weight of "GOHSENOL" AL-06 (polyvinyl alcohol having a degree of saponification of 91% to 94%, produced by NOF Corporation) was dissolved in 55 parts by weight of water, 14 parts by weight of methanol, 10 parts by weight of n-propanol, and 10 parts by weight of n-butanol to yield coating liquid composition 9 for a peel assist layer (D3).

<Preparation of Coating Liquid Composition 10 for Heat-Sensitive Mask Layer (C3)>

A mixture of 23 parts by weight of "MA100" (carbon black, produced by Mitsubishi Chemical Corporation), 15 parts by weight of "DIANAL" BR-95 (alcohol-insoluble acrylic resin, produced by Mitsubishi Rayon Co., Ltd.), 6 parts by weight of a plasticizer ATBC (tributyl acetylcitrate, produced by J-PLUS Co., Ltd.), and 30 parts by weight of "PM acetate" (propylene glycol monomethyl ether acetate, produced by Osaka Printing Ink MFG. Co., Ltd.) was prepared in advance, and then kneaded and dispersed with a three-roll mill to prepare carbon black dispersion liquid 2. To dispersion liquid 2 were added 20 parts by weight of "Araldite" 6071 (epoxy resin, produced by Asahi-Ciba Limited), 27 parts by weight of "U-VAN" 2061 (melamine resin, produced by Mitsui Chemicals, Inc.), 0.7 parts by weight of "Light Ester" P-1M (phosphate monomer, produced by Kyoeisha Chemical Co., Ltd.), and 140 parts by weight of methylisobutyl ketone, and the mixture was stirred for 30 minutes. Then, "PM acetate" was added to the mixture so that the solid content would be 33 percent by weight. Thus, coating liquid composition 10 for a heat-sensitive mask layer (C3) was obtained.

<Preparation of Coating Liquid Composition 11 for Heat-Sensitive Mask Layer (C4)>

A mixture of 23 parts by weight of "MA100" (carbon black, produced by Mitsubishi Chemical Corporation), 15 parts by weight of "DIANAL" BR-95 (alcohol-insoluble acrylic resin, produced by Mitsubishi Rayon Co., Ltd.), 6 parts by weight of a plasticizer ATBC (tributyl acetylcitrate, produced by J-PLUS Co., Ltd.), and 30 parts by weight of diethylene glycol monoethyl ether monoacetate was prepared in advance, and then kneaded and dispersed with a three-roll mill to prepare carbon black dispersion liquid 3. To dispersion liquid 3 were added 20 parts by weight of "Araldite" 6071 (epoxy resin, produced by Asahi-Ciba Limited), 27 parts by weight of "U-VAN" 2061 (melamine resin, produced by Mitsui Chemicals, Inc.), 0.7 part by weight of "Light Ester" P-1M (phosphate monomer, produced by Kyoeisha Chemical Co., Ltd.), and 140 parts by weight of methylisobutyl ketone, and the mixture was stirred for 30 minutes. Then, diethylene glycol monoethyl ether monoacetate was added to the mixture so that the solid content would be 33 percent by weight. Thus, coating liquid composition 11 for a heat-sensitive mask layer (C3) was obtained.

<Preparation of Coating Liquid Composition 12 for Adhesion-Adjusting Layer (B3)>

In 41 parts by weight of methyl ethyl ketone and 41 parts by weight of ethyl Cellosolve was dissolved 18 parts by weight of "Epikote" 1256 (epoxy resin, produced by Japan Epoxy Resins Co., Ltd.) to yield coating liquid composition 12 for an adhesion-adjusting layer (B3).

<Production of Heat-Sensitive Mask Element 5>

Coating liquid composition 9 was applied onto a 100 μm thick polyester film "Lumirror" S10 (produced by Toray Industries Inc.) with a bar coater so that the thickness would be 0.25 μm after drying, and dried at 100° C. for 25 seconds to yield a composite of peel assist layer (D3)/protective layer (E). Coating liquid composition 10 was applied onto the peel assist layer (D3) of the resulting composite with a bar coater so that the thickness would be 2 μm after drying, and dried at 140° C. for 90 seconds to yield heat-sensitive mask element 5, which is a composite of heat-sensitive mask layer (C3)/peel assist layer (D3)/protective layer (E). The optical density (orthochromatic filter, transmission mode) of heat-sensitive mask element 5 was 3.8.

<Production of Heat-Sensitive Mask Element 6>

Coating liquid composition 9 was applied onto a 100 μm thick polyester film "Lumirror" S10 (produced by Toray Industries Inc.) with a bar coater so that the thickness would be 0.25 μm after drying, and dried at 100° C. for 25 seconds to yield a composite of peel assist layer (D3)/protective layer (E). Coating liquid composition 11 was applied onto the peel assist layer (D3) of the resulting composite with a bar coater so that the thickness would be 2 μm after drying, and dried at 140° C. for 90 seconds to yield heat-sensitive mask element 6, which is a composite of heat-sensitive mask layer (C4)/peel assist layer (D3)/protective layer (E). The optical density (orthochromatic filter, transmission mode) of heat-sensitive mask element 6 was 3.8.

<Production of Heat-Sensitive Mask Element 7>

Coating liquid composition 9 was applied onto a 100 μm thick polyester film "Lumirror" S10 (produced by Toray Industries Inc.) with a bar coater so that the thickness would be 0.25 μm after drying, and dried at 100° C. for 25 seconds to yield a composite of peel assist layer (D3)/protective layer (E). Coating liquid composition 10 was applied onto the peel assist layer (D3) of the resulting composite with a bar coater so that the thickness would be 2 μm after drying, and dried at 140° C. for 90 seconds to yield a composite of heat-sensitive mask layer (C3)/peel assist layer (D3)/protective layer (E). Coating liquid composition 12 was applied onto the peel assist layer (C3) of the resulting composite with a bar coater so that the thickness would be 1 μm after drying, and dried at 140° C. for 60 seconds to yield a heat-sensitive mask element 7, which is a composite of adhesion-adjusting layer (B3)/heat-sensitive mask layer (C3)/peel assist layer (D3)/protective layer (E). The optical density (orthochromatic filter, transmission mode) of heat-sensitive mask element 7 was 3.8.

Example 4

Coating liquid composition 8 was applied onto the photosensitive resin layer (A2) of photosensitive resin sheet 2, and heat-sensitive mask element 5 was disposed on the photosensitive resin layer (A2) to which coating liquid composition 8 had been applied, such that the heat-sensitive mask layer (C3) of heat-sensitive mask element 5 came into contact with the photosensitive resin layer (A2). These layers were laminated with a calender roll heated to 80° C. to yield photosensitive resin printing plate precursor 5 which had the layered structure of adhesive-coated substrate 2/photosensitive resin layer (A2)/heat-sensitive mask layer (C3)/peel assist layer (D3)/protective layer (E) deposited in that order. The clearance of the calender roll was adjusted so that the thickness of the composite would be 950 μm after peel of the protective layer (E) from printing plate precursor 5. The applied coating liquid composition 8 was allowed to stand for about one week after lamination, and thereby the remaining solvent was air-dried to form an additional thickness of the photosensitive resin layer (A2).

After peel of the protective layer (E), the photosensitive resin printing plate precursor 5 was attached on an external drum type plate setter "CDI SPARK" (manufactured by Esko-Graphics NV), equipped with a fiber laser emitting light in the infrared region such that the substrate came into contact with the drum. A test pattern of a resolution of 156 lines per inch (including solid -pattern regions, 1% to 99% half tone, 1 to 8 point fine lines, and a 1 to 8 point reverse pattern regions) was drawn, so that the heat-sensitive mask layer (C3) was formed into an image mask (C3'). The heat-sensitive mask layer (C3) in the solid pattern was substantially ablated with laser light under the conditions of a laser power of 9 W and a drum rotational speed of 500 rpm, without negative effects of excessive laser power, such as laser excavation of the surface of the underlying photosensitive resin layer (A2) and deformation of the drawn pattern.

In addition, the heat-sensitive mask layer (C3) was resistant to external flaws because of its crosslinked structure. This made it easy to handle of the printing plate precursor in attaching on the plate setter. The scratch resistance of the heat-sensitive mask layer (C3) was evaluated in the same manner as in Example 1. As a result, even after 10 reciprocations of rubbing the surface, there was no scratch penetrating through the black heat-sensitive mask layer (C3).

Then, the entire surface of the plate through the image mask (C3') was exposed to light (exposure: 1000 mJ/cm$^2$) from a super-high-pressure mercury lamp manufactured by ORC MFG. Co., Ltd.) having a light source in the ultraviolet region.

Subsequently, development was performed in tap water of 35° C. for 1.5 minutes with a brush-type developing machine FTW500II (manufactured by Toray Industries Inc.) equipped with a PBT (polybutylene terephthalate) brush. Consequently, the peel assist layer (D3), the image mask (C3'), and the portion not exposed to ultraviolet light of the photosensitive resin layer (A2), which was covered with the image mask, were selectively developed to form a relief being the faithful negative of the image mask (C3'). Although the heat-sensitive mask layer (C3) itself was crosslinked and hydrophobic, and was therefore insoluble in water, the layer (C3) was able to be developed finally by setting the thickness of the layer (C3) as small as 2 μm and by mechanically rubbing with an rigid brush.

The resulting relief was composed of only the photosensitive resin layer (A2), containing no black image mask (C3'), and had a sharp shape. This is because the heat-sensitive mask layer (C3) is crosslinked and insoluble in water. The heat-sensitive mask layer (C3) and the hydrophilic photosensitive resin layer (A2) are maintained independently without mixing with each other.

Example 5

Coating liquid composition 8 was applied onto the photosensitive resin layer (A2) of photosensitive resin sheet 2, and heat-sensitive mask element 6 was disposed on the photosensitive resin layer (A2) to which coating liquid composition 8 had been applied, such that the heat-sensitive mask layer (C4) of heat-sensitive mask element 6 came into contact with the photosensitive resin layer (A2). These layers were laminated with a calender roll heated to 80° C. to yield photosensitive resin printing plate precursor 6 which has the layered structure of adhesive-coated substrate 2/photosensitive resin layer (A2)/heat-sensitive mask layer (C4)/peel assist layer (D3)/protective layer (E) deposited in that order. The clearance of the calender roll was adjusted so that the thickness of the composite would be 950 μm after peel of the protective layer (E) from printing plate precursor 6. The applied coating liquid composition 8 was allowed to stand for about one week after lamination, and thereby the remaining solvent was air-dried to form an additional thickness of the photosensitive resin layer (A2).

After peel of the protective layer (E), the photosensitive resin printing plate precursor 6 was attached on an external drum type plate setter "CDI SPARK" (manufactured by Esko-Graphics NV), equipped with a fiber laser emitting light in the infrared region such that the substrate came into contact with the drum. A test pattern of a resolution of 156 lines per inch (including solid pattern regions, 1% to 99% halftone, 1 to 8 point fine lines, and a 1 to 8 point reverse pattern regions) was drawn, so that the heat-sensitive mask layer (C4) was formed into an image mask (C4'). The heat-sensitive mask layer (C4) in the solid pattern was substantially ablated with laser light under the conditions of a laser power of 9 W and a drum rotational speed of 500 rpm, without negative effects of excessive laser power, such as laser excavation of the surface of the underlying photosensitive resin layer (A2) and deformation of the drawn pattern. In addition, the heat-sensitive mask layer (C4) was resistant to external flaws because of its crosslinked structure. This made it easy to handle the printing plate precursor in attaching on the plate setter. The scratch resistance of the heat-sensitive mask layer (C4) was evaluated in the same manner as in Example 1. As a result, even after 10 reciprocations of rubbing the surface, there was no scratch penetrating through the black heat-sensitive mask layer (C4).

Then, the entire surface of the plate through the image mask (C4') was exposed to light (exposure: 1000 mJ/cm$^2$)

from a super-high-pressure mercury lamp (manufactured by ORC MFG. Co., Ltd.) having a light source in the ultraviolet region.

Subsequently, development was performed in tap water of 35° C. for 1.5 minutes with a brush-type developing machine FTW500 II (manufactured by Toray Industries Inc.) equipped with a PBT (polybutylene terephthalate) brush. Consequently, the peel assist layer (D3), the image mask (C4'), and the portion not exposed to ultraviolet light of the photosensitive resin layer (A2), which was covered with the image mask, were selectively developed to form a relief being the faithful negative of the image mask (C4'). Although the heat-sensitive mask layer (C4) itself was crosslinked and hydrophobic, and was therefore insoluble in water, the layer (C4) was able to be developed finally by setting the thickness of the layer (C4) as small as 2 μm and by mechanically rubbing with an rigid brush.

The resulting relief was composed of only the photosensitive resin layer (A2), containing no black image mask (C4'), and had a sharp shape. This is because the heat-sensitive mask layer (C4) is crosslinked and insoluble in water. The heat-sensitive mask layer (C4) and the hydrophilic photosensitive resin layer (A2) are maintained independently without mixing with each other.

Example 6

Coating liquid composition 8 was applied onto the photosensitive resin layer (A2) of photosensitive resin sheet 2, and heat-sensitive mask element 7 was disposed on the photosensitive resin layer (A2) to which coating liquid composition 8 had been applied, such that the adhesion-adjusting layer (B3) of the heat-sensitive mask element 7 came into contact with the photosensitive resin layer (A2). These layers were laminated with a calender roll heated to 80° C. to yield photosensitive resin printing plate precursor 7 which had the layered structure of adhesive-coated substrate 2/photosensitive resin layer (A2)/adhesion-adjusting layer (B3)/heat-sensitive mask layer (C3)/peel assist layer (D3)/protective layer (E) deposited in that order. The clearance of the calender roll was adjusted so that the thickness of the composite would be 950 μm after peel of the protective layer (E) from the printing plate precursor 7. The applied coating liquid composition 8 was allowed to stand for about one week after lamination, and thereby the remaining solvent was air-dried to form an additional thickness of the photosensitive resin layer (A2).

After peel of the protective layer (E), photosensitive resin printing plate precursor 7 was attached on an external drum type plate setter "CDI SPARK" (manufactured by Esko-Graphics NV), equipped with a fiber laser emitting light in the infrared region such that the substrate came into contact with the drum. A test pattern of a resolution of 156 lines per inch (including solid pattern regions, 1% to 99% half tone, 1 to 8 point fine lines, and a 1 to 8 point reverse pattern regions) was drawn, so that the heat-sensitive mask layer (C3) was formed into an image mask (C3'). The heat-sensitive mask layer (C3) in the solid pattern was substantially ablated with laser light under the conditions of a laser power of 9 W and a drum rotational speed of 500 rpm, without negative effects of excessive laser power, such as laser excavation of the surface of the underlying photosensitive resin layer (A2) and deformation of the drawn pattern. In addition, the heat-sensitive mask layer (C3) was resistant to external flaws because of its crosslinked structure. This made it easy to handle the printing plate precursor in attaching on the plate setter.

Then, the entire surface of the plate through the image mask (C3') was exposed to light (exposure: 1000 mJ/cm$^2$) from a super-high-pressure mercury lamp (manufactured by ORC MFG. Co., Ltd.) having a light source in the ultraviolet region.

Subsequently, development was performed in tap water of 35° C. for 1.5 minutes with a brush-type developing machine FTW500II (manufactured by Toray Industries Inc.) equipped with a PBT (polybutylene terephthalate) brush. Consequently, the peel assist layer (D3), the image mask (C3'), and the portion not exposed to ultraviolet light of the photosensitive resin layer (A2), which was covered with the image mask, were selectively developed to form a relief being the faithful negative of the image mask (C3'). Although the heat-sensitive mask layer (C3) itself was crosslinked and hydrophobic, and was therefore insoluble in water, the layer (C3) was able to be developed finally by setting the thickness of the layer (C3) as small as 2 μm and by mechanically rubbing with an rigid brush.

The resulting relief was composed of only the photosensitive resin layer (A2), containing no black image mask (C3'), and had a sharp shape. This is because the heat-sensitive mask layer (C3) is crosslinked and insoluble in water. The heat-sensitive mask layer (C3) and the hydrophilic photosensitive resin layer (A2) are maintained independently without mixing with each other.

<Production of Heat-Sensitive Mask Element 8>

Coating liquid composition 9 was applied onto a 100 μm thick polyester film "Lumirror" S10 (produced by Toray Industries Inc.) with a bar coater so that the thickness would be 0.25 μm after drying, and dried at 100° C. for 25 seconds to yield a composite of peel assist layer (D3)/protective layer (E). An aluminum thin film was formed on the peel assist layer (D3) of the resulting composite by vacuum vapor deposition to yield heat-sensitive mask element 8, which is a composite of heat-sensitive mask layer (C5)/peel assist layer (D3)/protective layer (E) and which has an optical density (orthochromatic filter, transmission mode) of 3.5.

<Production of Heat-Sensitive Mask Element 9>

Heat-sensitive mask element 9 was produced in the same manner as in heat-sensitive mask element 8, except that the layer (C5) of heat-sensitive mask element 8 was replaced with a layer (C6) formed by metal vapor deposition of tellurium. The optical density (orthochromatic filter, transmission mode) of element 9 was 3.8.

Example 7

Coating liquid composition 8 was applied onto the photosensitive resin layer (A2) of photosensitive resin sheet 2, and the heat-sensitive mask element 8 was disposed on the photosensitive resin layer (A2) to which coating liquid composition 8 had been applied, such that the heat-sensitive mask layer (C5) of heat-sensitive mask element 8 came into contact with the photosensitive resin layer (A2). These layers were laminated with a calender roll heated to 80° C. to yield photosensitive resin printing plate precursor 8 which has the layered structure of adhesive-coated substrate 2/photosensitive resin layer (A2)/heat-sensitive mask layer (C5)/peel assist layer (D3)/protective layer (E) deposited in that order. The clearance of the calender roll was adjusted so that the thickness of the composite would be 950 µm after peel of the protective layer (E) from the printing plate precursor 8. The applied coating liquid composition 8 was allowed to stand for about one week after lamination, and thereby the remaining solvent was air-dried to form an additional thickness of the photosensitive resin layer (A2).

The heat-sensitive mask layer (C5) can be subjected to laser drawing under the conditions of a laser power of 9 W and drum rotational speed of 500 rpm, as in Example 4, without negative effects, such as laser excavation of the surface of the underlying photosensitive resin layer (A2) and deformation of the drawn pattern.

The scratch resistance of the heat-sensitive mask layer (C5) was evaluated in the same manner as in Example 1. Although a penetrating scratch occurred by 7 reciprocations of rubbing the surface, the heat-sensitive mask layer can be used in practice.

Exposure of the entire surface with a super-high-pressure mercury lamp and development with water were performed in the same manner as in Example 4 to yield a letterpress printing plate having a sharp relief. Since the heat-sensitive mask layer (C5) is made of metal thin film of aluminium and is not mixed with the photosensitive resin layer (A2), the photosensitive resin layer (A2) can be cured with light without negative effects. Although aluminum metal itself is insoluble in water, the heat-sensitive mask layer (C5) can be scrubbed out with an rigid brush because the thickness is very small, thus, finally developed with water.

Example 8

Photosensitive resin printing plate precursor 9 was produced in the same manner as in Example 7, except that heat-sensitive mask element 8 was replaced with heat-sensitive mask element 9.

The laser drawing on the heat-sensitive mask layer (C6) can be performed under conditions of a substantially lower energy density than in Example 7 using the aluminum deposition film, that is, a laser power of 6 W and drum rotational speed of 500 rpm, without laser excavation of the surface of the underlying photosensitive resin layer (A2) and deformation of the drawn pattern.

As for the scratch resistance of the heat-sensitive mask layer (C6), a penetrating scratch occurred by 7 reciprocations of rubbing the surface, but there was no problem in practice. Mass transfer is not observed between the heat-sensitive mask layer (C6) and the photosensitive resin layer (A2), and hence the photosensitive resin layer (A2) can be cured with light without negative effects. Although tellurium metal is insoluble in water, the heat-sensitive mask layer (C6) can be scrubbed out with an rigid brush because the thickness is very small, thus, finally developed with water.

<Production of Heat-Sensitive Mask Element 10>

Heat-sensitive mask element 10, which is a composite of heat-sensitive mask layer (C2)/peel assist layer (D1)/protective layer (E) was produced in the same process as in Example 1, except that coating liquid 3 for the layer (C1) of heat-sensitive mask composite 1 used in Example 1 was replaced with coating liquid 7 for the layer (C2), the dried thickness of the layer (C2) was set at 6 µm, and the layer (C2) was dried at 120° C. for 30 seconds. The optical density (orthochromatic filter, transmission mode) of the resulting heat-sensitive mask element 10 was 3.4.

<Production of Heat-Sensitive Mask Element 11>

Heat-sensitive mask element 11, which is a composite of heat-sensitive mask layer (C2)/peel assist layer (D3)/protective layer (E), was produced in the same process as in Example 4, except that coating liquid 10 for the layer (C3) of heat-sensitive mask element 5 used in Example 4 was replaced with coating liquid 7 for the layer (C2), the dried thickness of the layer (C2) was set at 6 µm, and the layer (C2) was dried at 120° C. for 30 seconds. The optical density (orthochromatic filter, transmission mode) of the resulting heat-sensitive mask element 11 was 3.4.

Comparative Example 2

Photosensitive resin printing plate precursor 10, which is a composite of substrate/photosensitive resin layer (A1)/heat-sensitive mask layer (C2)/peel assist layer (D1)/protective layer (E), was produced in the same process as in Example 1, except that heat-sensitive mask element 1 was replaced with heat-sensitive mask element 10. The resulting printing plate precursor was different from printing plate precursor 1 evaluated in Example 1 in that non-crosslinked, water-soluble heat-sensitive mask layer (C2) was used instead of heat-sensitive mask layer (C1) having a crosslinked structure.

The precursor was evaluated as in Example 1. As a result, problems resulting from the use of non-crosslinked, water-soluble heat-sensitive mask layer (C2) occurred as in Comparative Example 1, such as low scratch resistance of the heat-sensitive mask layer and deterioration of the relief reproduction due to mass transfer between the layer (C) and the layer (A).

Comparative Example 3

Photosensitive resin printing plate precursor 11, which is a composite of substrate/photosensitive resin layer (A2)/heat-sensitive mask layer (C2)/peel assist layer (D3)/protective layer (E), was produced in the same process as in Example 4, except that heat-sensitive mask element 5 was replaced with heat-sensitive mask element 11. The resulting printing plate precursor was different from the printing plate precursor 5 evaluated in Example 4 in that non-crosslinked, water-soluble heat-sensitive mask layer (C2) was used instead of heat-sensitive mask layer (C3) having a crosslinked structure.

The precursor was evaluated as in Example 4. As a result, problems resulting from the use of non-crosslinked, water-soluble heat-sensitive mask layer (C2) occurred as in Comparative Example 1, such as low scratch resistance of the heat-sensitive mask layer and deterioration of the relief reproduction due to mass transfer between layer (C) and layer (A).

TABLE 1

| Structure of photosensitive resin printing plate precursor | | | Example | | | | | | | | Comparative example | | |
|---|---|---|---|---|---|---|---|---|---|---|---|---|---|
| component | description | | 1 | 2 | 3 | 4 | 5 | 6 | 7 | 8 | 1 | 2 | 3 |
| Support | | | Substrate 1 coated with polyester adhesive | | | | | Adhesive-coated substrate 2 | | | Same as Example 1 | | Same as Example 4 |
| Photosensitive resin layer (A) | Identifier | | Layer (A1) | | | | | Layer (A2) | | | Same as Example 1 | Layer (A1) | Layer (A2) |
| | Water/alcohol-soluble or dispersible resin | | Water-soluble polyamide resin 1: 50 parts by weight | | | | | Water-soluble polyamide resin 2: 7.5 parts by weight Modified polyvinyl alcohol 1: 47.5 parts by weight | | | | Same as Example 1 | Same as Example 4 |
| | UV-curable monomer | | Blemmer G: 1.5 parts by weight Blemmer GMR: 8 parts by weight HOA-MPE: 24 parts by weight N,N-tetra(2-hydroxy-3-methacroyloxypropyl)-m-xylenediamine: 5 parts by weight NK Ester A-TMM-3: 4 parts by weight | | | | | Blemmer G: 3 parts by weight Blemmer GMR: 12 parts by weight Light Ester G201P: 5 parts by weight Epoxy Ester 70PA: 6 parts by weight NK Ester A-200: 5 parts by weight | | | | | |
| Adhesion-adjusting layer (B) | Identifier | | Not provided | Not provided | Not provided | Not provided | Not provided | Layer (B3) | Not provided | Not provided | Layer (B2) | Not provided | Not provided |
| | Water/alcohol-soluble or dispersible resin | | | | | | | Water-soluble polyamide resin 1 (not contained) | | | "Mowiol" 4-80 | | |
| | Water-insoluble resin | | | | | | | "Epikote"1256 (not contained) | | | (not contained) | | |
| Heat-sensitive mask layer (C) | Identifier | | Layer (C1) | | | Layer(C3) | Layer (C4) | Layer (C3) | Layer (C5) | Layer (C6) | Layer (C2) | | |
| | IR-absorbable material | | "MA 100" (carbon black): 25 parts by weight | | | "MA 100" (carbon black): 23 parts by weight | | | Vapor-deposited aluminum film | Vapor-deposited tellurium film | "Printex" U (carbon black): 2 parts by weight | | |
| | UV-absorbable material | | Nitrocotton "SL-1"(nitrocellulose): 26 parts by weight | | | "DIANAL" BR-95 (acrylic resin): 15 parts by weight | | | | | (Not contained) | | |
| | Pyrolyzable compound | | "Araldite" 6071: 17 parts by weight "U-VAN" 2061: 24 parts by weight | | | "Araldite" 6071: 20 parts by weight "U-VAN" 2061: 27 parts by weight | | | | | | | |
| | Water insolubilizer | | (Nitrocotton SL-1 is dissolved in alcohol.) | | | (Not contained) | | | | | (Not contained) | | |
| | Water/alcohol-soluble or dispersible resin | | | | | | | | | | | | |
| | Solvent*1 for coating liquid | | Solvent A Solvent C | | | Solvent A Solvent C | Solvent B Solvent C | Solvent A Solvent C | | | | | |
| Peel assist layer (D) | Identifier | | Layer (D1) | Layer (D2) | | | | Layer (D3) | | | (Not provided) | Layer (D1) | Layer (D3) |
| | Resin | | GOHSENOL AL-06 (Not contained) | GOHSENOL AL-06: 100 parts by weight | | | | GOHSENOL AL-06: | | | | Same as Example 1 | Same as Example 4 |
| | IR-absorbable material | | | PRPJET 825: 2 parts by weight | | | | (Not contained) | | | "KP205": 8 parts by weight | n-Propanol Water | |
| Protective layer (E) | | | | | | | | Lumirror S10 (thickness: 100 μm) | | | | | |
| Production of photosensitive resin printing plate precursor | Photosensitive resin sheet | | Sheet 1 | | | | | Sheet 2 | | | Sheet 1 | | Sheet 2 |
| | Heat-sensitive mask element | | Element 1 | Element 2 | Element 3 | Element 5 | Element 6 | Element 7 | Element 8 | Element 9 | Element 4 | Element 10 | Element 11 |
| | Photosensitive resin printing plate precursor | | Precursor 1 | Precursor 2 | Precursor 3 | Precursor 5 | Precursor 6 | Precursor 7 | Precursor 8 | Precursor 9 | Precursor 4 | Precursor 10 | Precursor 11 |

*1Solvent A: "PM acetate" (propylene glycol monomethyl ether acetate)
Solvent B: diethylene glycol monoethyl ether monoacetate
Solvent C: methylisobutyl ketone

TABLE 2

| | | Example | | | | | | | | Comparative Example | | |
|---|---|---|---|---|---|---|---|---|---|---|---|---|
| | | 1 | 2 | 3 | 4 | 5 | 6 | 7 | 8 | 1 | 2 | 3 |
| Step (1) | Printing plate structure Corresponding claims | 1 to 3, 7, 10 | 1 to 3, 7, 10, 11 | 1 to 3, 5 to 10, 11 | 1 to 3, 7 to 10 | | 1 to 3, 5, 7 to 10 | | 1, 4, 7, 8, 10 | None | | |
| Step (2) | Conditions for drawing mask pattern on layer (C) with IR laser | 6 W 300 rpm | 6 W 500 rpm | | Drawing with CDI SPARK (fiber laser) 9 W 500 rpm | | | | 6 W 500 rpm | 6 W 300 rpm | 9 W 500 rpm | |
| Step (3) | Formation of latent image with UV light | 900 mJ/cm² | | | UV exposure with super-high-pressure mercury lamp 1000 mJ/cm² | | | | | 900 mJ/cm² | 1000 mJ/cm² | |
| Step (4) | Development | 25° C. tap water 1.5 min | | | | | 35° C. tap water 1.5 min | | | 25° C. tap water 1.5 min | | |
| Scratch resistance of heat-sensitive mask layer (C) (number of scrubs to form penetrating scratch) | | Layer (C1) >10 | | Layer (C3) >10 | Layer (C4) >10 | | Layer (C3) >10 | Layer (C5) 7 | Layer (C6) 7 | Layer (C2) 1 | | |
| Layer (C)/Layer (A) mass transfer | | | | | | None | | | | | Occurred | |
| Resulting relief | | | | | | Sharp | | | | | Deformed | |

The invention claimed is:

1. A photosensitive resin printing plate precursor for letterpress printing comprising, on a support in this order: a photosensitive resin layer (A) containing a water-soluble or water-dispersible resin and an ultraviolet-curable monomer; optionally, an adhesion-adjusting layer (B) containing a water-soluble or water-dispersible resin; a water-insoluble heat-sensitive mask layer (C) containing an infrared-absorbing material, a peel assist layer (D) having a thickness of 0.1 to 6 μm, and a protective layer (E), wherein the absence of the adhesion-adjusting layer (B), the water insoluble heat-sensitive mask layer (C) is formed in contact with the photosensitive resin layer (A), and in the presence of the adhesion-adjusting layer (B), the water-insoluble heat-sensitive mask layer (C) is formed in contact with the adhesion adjusting layer (B).

2. The photosensitive resin printing plate precursor according to claim 1, wherein the water-insoluble heat-sensitive mask layer (C) contains crosslinked curable resin.

3. The photosensitive resin printing plate precursor according to claim 2, wherein the curable resin is a combination of: at least one compound selected from the group consisting of multifunctional isocyanates and multifunctional epoxy compounds; and at least one compound selected from the group consisting of urea-based resins, amine-based compounds, amide-based compounds, hydroxyl group-containing compounds, carboxylic compounds, and thiol-based compounds.

4. The photosensitive resin printing plate precursor according to claim 1, wherein the water-insoluble heat-sensitive mask layer (C) is a metal thin film.

5. The photosensitive resin printing plate precursor according to claim 1, further comprising an adhesion-adjusting layer (B) between the photosensitive resin layer (A) and the heat-sensitive mask layer (C).

6. The photosensitive resin printing plate precursor according to claim 5, wherein the adhesion-adjusting layer (B) contains a water-soluble or water-dispersible resin.

7. The photosensitive resin printing plate precursor according to claim 1, wherein the photosensitive resin layer (A) contains a polyamide resin.

8. The photosensitive resin printing plate precursor according to claim 1, wherein the photosensitive resin layer (A) contains polyvinyl alcohol, partially saponified polyvinyl alcohol, or their modified form.

9. The photosensitive resin printing plate precursor according to claim 1, wherein the heat-sensitive mask layer (C) contains an acrylic resin and no nitrocellulose.

10. The photosensitive resin printing plate precursor according to claim 1, wherein the peel assist layer (D) contains an infrared-absorbing material and/or a pyrolyzable compound.

11. The photosensitive resin printing plate precursor according to claim 1, wherein the peel assist layer (D) remains on the heat-sensitive mask layer side after peeling off the protective layer (E).

12. The photosensitive resin printing plate precursor according to claim 1, wherein the photosensitive resin layer (A) contains a water-soluble or water-dispersible resin and ultraviolet-curable monomer, without elastmeric binder.

13. A method for producing a photosensitive resin printing plate precursor, the method comprising the steps of:
  (i) forming a photosensitive resin sheet by depositing a photosensitive resin layer (A) on a substrate;
  (ii) forming a heat-sensitive mask element including a water-insoluble heat-sensitive mask layer (C), a protective layer (E) and a peel assist layer (D) having a thickness of 0.1 to 6 μm disposed between the protective layer (E) and the heat-sensitive mask layer (C); and
  (iii) laminating the surface of the photosensitive resin layer (A) of the photosensitive resin sheet to the heat-sensitive mask layer (C) of the heat-sensitive mask element.

14. The method for producing the photosensitive resin printing plate precursor according to claim 13, wherein the heat-sensitive mask element includes the heat-sensitive mask layer (C) and an adhesion-adjusting layer (B), and the lamination is performed such that the adhesion-adjusting layer (B) of the heat-sensitive mask element comes into contact with the surface of the photosensitive resin layer (A).

15. The method for producing the photosensitive resin printing plate precursor according to claim 13, wherein, in the step of forming the heat-sensitive mask element, the heat-sensitive mask layer (C) is deposited while being heated, thereby forming a crosslinked structure therein.

16. A method for producing a letterpress printing plate comprising:
(1) preparing a photosensitive resin printing plate precursor comprising, on a support in this order: a photosensitive resin layer (A) containing a water-soluble or water-dispersible resin and an ultraviolet-curable monomer; a water-insoluble heat-sensitive mask layer (C) containing an infrared-absorbing material; a peel assist layer (D) having a thickness of 0.1 to 6 μm and a protective layer (E);
(2) forming an image mask (C') by imagewise irradiating the heat-sensitive mask layer (C) with infrared laser light;
(3) exposing through the image mask (C') to ultraviolet light to form a latent image on the photosensitive resin layer (A); and
(4) removing the image mask (C') and portions unexposed to ultraviolet light of the photosensitive resin layer (A) by development with a water-based liquid,
wherein at least part of the protective layer (E) is peeled before the heat-sensitive mask layer (C) is imagewise irradiated with infrared laser light.

* * * * *